(12) United States Patent
Fujita et al.

(10) Patent No.: US 9,303,833 B2
(45) Date of Patent: *Apr. 5, 2016

(54) LIGHTING DEVICE

(71) Applicant: ROHM CO., LTD., Kyoto (JP)

(72) Inventors: Toshiyuki Fujita, Kyoto (JP); Toshio Watanabe, Kyoto (JP); Yusaku Kawabata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/568,935

(22) Filed: Dec. 12, 2014

(65) Prior Publication Data

US 2015/0138773 A1    May 21, 2015

Related U.S. Application Data

(63) Continuation of application No. 13/058,822, filed as application No. PCT/JP2009/003838 on Aug. 10, 2009, now Pat. No. 8,915,610.

(30) Foreign Application Priority Data

| Aug. 11, 2008 | (JP) | ................................ | 2008-206865 |
| Dec. 12, 2008 | (JP) | ................................ | 2008-317048 |
| Dec. 22, 2008 | (JP) | ................................ | 2008-324837 |
| Jan. 9, 2009 | (JP) | ................................ | 2009-003727 |
| Apr. 27, 2009 | (JP) | ................................ | 2009-108334 |

(51) Int. Cl.
*H05B 37/00* (2006.01)
*H05B 39/00* (2006.01)
(Continued)

(52) U.S. Cl.
CPC .. *F21S 4/008* (2013.01); *F21S 8/02* (2013.01); *F21V 23/005* (2013.01); *F21V 23/02* (2013.01);
(Continued)

(58) Field of Classification Search
CPC .......................... H01L 25/0753; H01L 33/507
USPC .................. 362/84, 97.3, 227, 231, 236, 240, 362/249.02, 362, 555, 612, 613, 800; 257/79, 99; 315/185 R, 291, 307, 308, 315/312; 313/498, 512

See application file for complete search history.

(56) References Cited

U.S. PATENT DOCUMENTS 8,915,610 B2 * 12/2014 Fujita et al. .................... 362/227
2003/0147254 A1    8/2003 Yoneda et al.
(Continued)

FOREIGN PATENT DOCUMENTS

| CN | 1464953 A | 12/2003 |
| CN | 2859218 Y | 1/2007 |

(Continued)

OTHER PUBLICATIONS

Transistor Technology. Feb. 2006. p. 129-135.

(Continued)

*Primary Examiner* — Nimeshkumar Patel
*Assistant Examiner* — Kevin Quarterman
(74) *Attorney, Agent, or Firm* — Rabin & Berdo, P.C.

(57) ABSTRACT

A lighting device includes a substrate and a planar light source portion including a plurality of LED chips arrayed on the substrate. The planar light source portion faces an illumination space (space to be illuminated) by a predetermined opening area. The plurality of LED chips are arrayed on the substrate such that the mounting density with respect to the opening area is not less than $3/cm^2$, and accordingly, a planar light source is formed.

20 Claims, 30 Drawing Sheets

DETAILS OF PORTION S1

(51) Int. Cl.
*H05B 41/00* (2006.01)
*F21S 4/00* (2006.01)
*F21S 8/02* (2006.01)
*H05B 33/08* (2006.01)
*F21V 23/00* (2015.01)
*F21V 23/02* (2006.01)
*F21Y 105/00* (2006.01)
*F21Y 101/02* (2006.01)

(52) U.S. Cl.
CPC ........ *H05B 33/0803* (2013.01); *H05B 33/0821* (2013.01); *F21Y 2101/02* (2013.01); *F21Y 2105/001* (2013.01)

(56) References Cited

U.S. PATENT DOCUMENTS

| | | |
|---|---|---|
| 2003/0189829 A1 | 10/2003 | Shimizu et al. |
| 2004/0233671 A1 | 11/2004 | Staufert |
| 2005/0057939 A1 | 3/2005 | Mizuyoshi |
| 2005/0237747 A1 | 10/2005 | Shimizu et al. |
| 2007/0291489 A1 | 12/2007 | Baroky et al. |
| 2008/0158872 A1 | 7/2008 | Inoue et al. |

FOREIGN PATENT DOCUMENTS

| | | |
|---|---|---|
| JP | 63-068887 A | 3/1988 |
| JP | 03-085773 A | 4/1991 |
| JP | 6-54103 U | 7/1994 |
| JP | 2000-076558 A | 3/2000 |
| JP | 2002-141555 A | 5/2002 |
| JP | 2002-199837 A | 7/2002 |
| JP | 2004-103443 A | 4/2004 |
| JP | 2004-179048 A | 6/2004 |
| JP | 2004-335426 A | 11/2004 |
| JP | 2005-229037 A | 8/2005 |
| JP | 2007-059371 A | 3/2007 |
| JP | 2007088210 A | 4/2007 |
| JP | 2007-300018 A | 11/2007 |
| JP | 2008-016417 A | 1/2008 |
| JP | 2008-118246 A | 5/2008 |
| JP | 2008-135355 A | 6/2008 |
| JP | 2008-135359 | 6/2008 |
| JP | 2008-288231 A | 11/2008 |
| JP | 2009-064637 A | 3/2009 |
| JP | 2009-071227 A | 4/2009 |
| JP | 2009-170126 A | 7/2009 |
| WO | WO-2008-050679 A1 | 5/2008 |
| WO | WO-2008069204 A1 | 6/2008 |

OTHER PUBLICATIONS

PCT International Preliminary Report on Patentability (Form PCT/IB 373).

Translation of the Japanese-language Written Opinion of the International Searching Authority (Form PCT/ISA 237).

English Translation of Chinese Office Action dated Aug. 6, 2012.

* cited by examiner

DETAILS OF PORTION S1

DETAILS OF PORTION S2

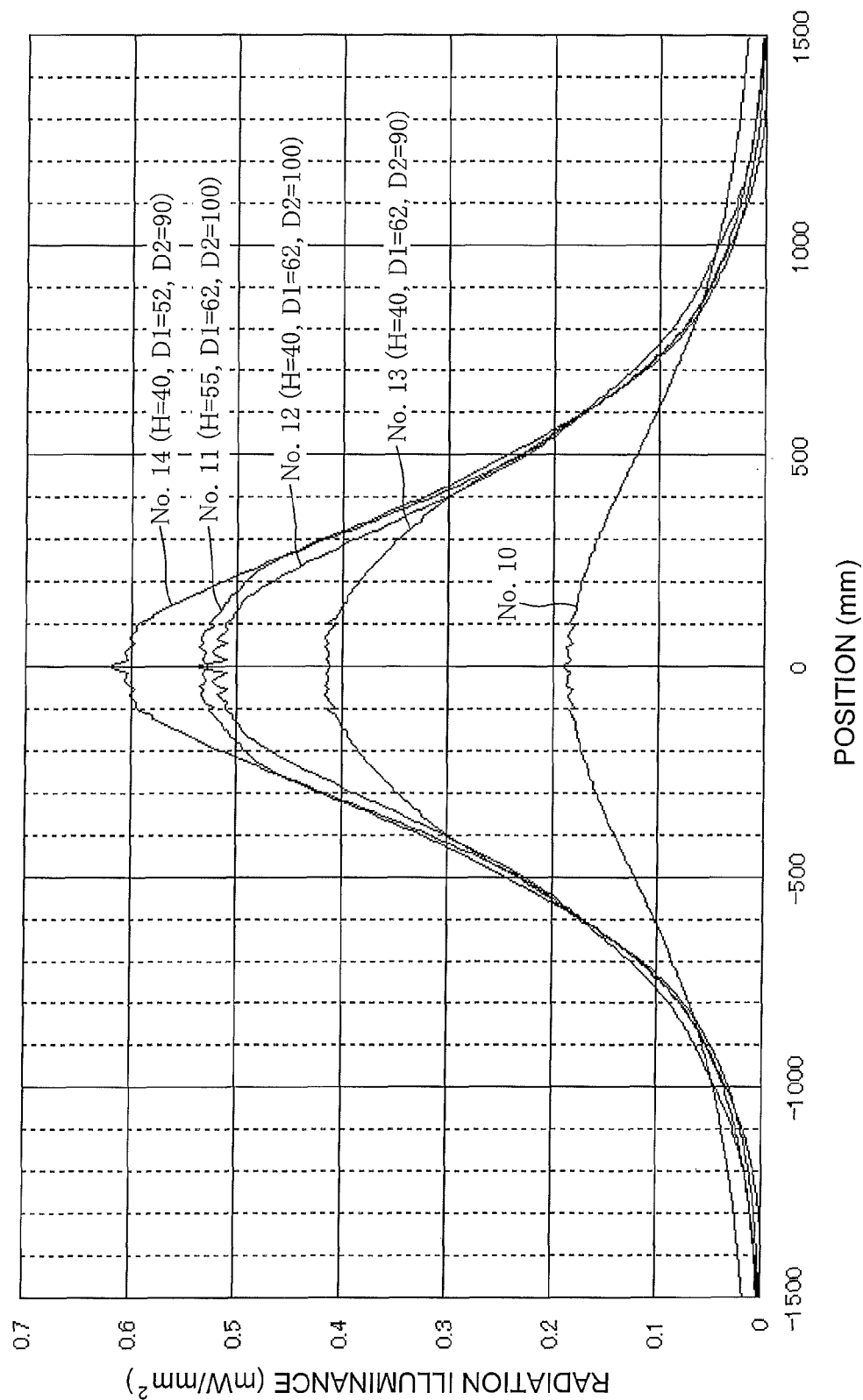

LIGHTING DEVICE

CROSS-REFERENCE TO THE RELATED APPLICATIONS

This is a continuation of U.S. application Ser. No. 13/058,822, filed Feb. 11, 2011 as the national phase of international application PCT/JP2009/003838, filed on Aug. 10, 2009. Furthermore, this application claims the benefit of foreign priority of Japanese application 2008-206865, filed Aug. 11, 2008, Japanese application 2008-317048, filed Dec. 12, 2008, Japanese application 2008-324837, filed Dec. 22, 2008, Japanese application 2009-003727, filed Jan. 9, 2009, and Japanese application 2009-108334, filed Apr. 27, 2009. The disclosures of these earlier Japanese, international, and US applications are incorporated herein by reference.

TECHNICAL FIELD

The present invention relates to a lighting device using light-emitting diodes (hereinafter, referred to as LEDs) as a light source. This lighting device may be mounted on, for example, a ceiling of a building, and used as a so-called downlight which performs downward illumination to a floor surface, etc. Also, this lighting device may have a form of an LED lamp which can be used as an alternative to the fluorescent lamp.

BACKGROUND ART

A downlight is a lighting device which is mounted in advance on a ceiling, etc., of a building, and is used to create, for example, a warm atmosphere by illuminating a floor or a table, etc. (for example, refer to Patent document 1). A conventional lighting device to be used for a downlight includes, for example, a halogen lamp as a light source. A halogen lamp is a so-called point light source which emits light in various directions. In order to direct light from the halogen lamp toward a desired range, the lighting device is provided with a cone-shaped reflector.

However, a halogen lamp emits light by supplying electricity to a filament as a resistor and generates a large amount of heat along with luminescence. Therefore, as compared with a fluorescent lamp, for example, the energy efficiency is inferior.

In order to direct light emitted in various directions from the halogen lamp toward a desired direction, the reflector inevitably has a comparatively large shape which is parabolic in a cross section, for example. Therefore, to attach the lighting device, a corresponding space must be secured on the ceiling.

FIG. 48 is a sectional view showing an example of a conventional LED lamp which can be used as an alternative to a fluorescent lamp (for example, refer to Patent Document 1). The LED lamp X1 shown in this drawing includes a long rectangular substrate 191, a plurality of LED modules 192 mounted on the substrate 191, a heat radiation member 195 to which the substrate 191 is attached, a case 193 housing the substrate 191, and terminals 194. On the substrate 191, a wiring pattern not shown to be connected to the plurality of LED modules 192 and the terminals 194 is formed. The LED lamp X1 is arranged to make a plurality of LED modules 192 emit light by fitting the terminals 194 into slots of sockets of a general fluorescent lamp lighting fixture.

However, in the LED lamp X1, when it is turned on, individual LED modules 192 look like point light sources. Therefore, in order to make the appearance of the LED lamp X1 look like a fluorescent lamp, it is necessary to greatly diffuse light from the LED modules 192 by the case 193. As the diffusion effect by the case 193 increases, the transmittance of the case 193 decreases. This deteriorates the luminous efficiency of the LED lamp X1.

If the current to be supplied to each LED module 192 is increased to increase the luminance of the whole LED lamp X1, heat generation from the LED modules 192 improperly increases. This also deteriorates the luminous efficiency of the LED lamp X1.

PRIOR ART DOCUMENT

Patent Documents

Patent Document 1: Japanese Unexamined Patent Application Publication No. 2008-016417
Patent Document 2: Japanese Unexamined Utility Model Application Publication No. H06-54103

SUMMARY OF THE INVENTION

Problem to be Solved by the Invention

An object of the present invention is to provide a lighting device excellent in energy efficiency.

A detailed object of the present invention is to provide a lighting device which is excellent in energy efficiency and can realize space-saving.

Another detailed object of the present invention is to provide a lighting device in the form of an LED lamp which emits light with uniform luminance and can increase the luminous efficiency.

Means for Solving the Problem

A lighting device to be provided according to a first aspect of the present invention includes a substrate and a planar light source portion including a plurality of LED chips arrayed on the substrate. In detail, the planar light source portion faces an illumination space (space to be illuminated) by a predetermined opening area. The plurality of LED chips are arrayed (preferably, arrayed uniformly) on the substrate such that the mounting density of the LED chips with respect to the opening area becomes not less than $3/cm^2$, and accordingly, a planar light source is formed. The opening area may be larger than the area of the substrate facing the illumination space. Specifically, the planar light source portion may face the illumination space by an opening area larger than the area of the substrate. The opening area may be an area of the substrate surface facing the illumination space. Specifically, the opening area facing the illumination space of the planar light source portion may be equal to the area of the substrate surface. In this case, when only a partial region of the substrate surface faces the illumination space, the area of the partial region is the opening area, and when the entire region of the substrate surface faces the illumination space, the area of the entire region is the opening area.

With this configuration, by arraying a plurality of LED chips at a high density on the substrate, a planar light source portion is formed. Therefore, as compared with a case where several high-luminance LEDs are used, the drive current per one chip can be reduced, so that the LED chips can be made to emit light in a current region with high energy efficiency. Therefore, a lighting device excellent in luminous efficiency can be realized. Also, a substantially planar light source can be formed by a high-density array of the LED chips, so that luminescence with a uniform luminance is realized. Further, the drive current per one chip is small, so that the heat generation amount can be reduced. Therefore, a measure for heat radiation can be easily taken, and accordingly, the configuration of the lighting device can be simplified and downsized.

Further, light emitted from the planar light source portion advances mainly in the normal direction of the surface of the substrate, and does not advance in various directions. Therefore, for example, as compared with a lighting device having a point light source such as a halogen lamp, a member for directing light toward a desired range, that is, for example, a reflector can be made smaller. Therefore, the lighting device can be downsized, and when attaching the lighting device, a mounting space on a ceiling can be made smaller.

A drive current per one chip of the plurality of LED chips is preferably not more than 40% (more preferably, not more than 20%) of the rated current of the chip. More specifically, the drive current per one chip of the plurality of LED chips is preferably a value within the range of 20±3% of the rated current of the chip. Still more specifically, the drive current per one chip of the plurality of LED chips may be not more than 8 mA (more preferably, not more than 4 mA).

In this drive current range, the LED chips have excellent luminous efficiency, so that a planar light source with excellent energy efficiency can be provided, and accordingly, a lighting device with excellent luminous efficiency can be realized.

When the drive current per one LED chip is high, the luminance of each LED chip increases and may cause illuminance unevenness. In detail, a shading pattern like stripes may be formed on the surface of an object (for example, a wall surface) at a short distance from the lighting device. On the other hand, when the drive current per one chip is designed within the above-described range, the illuminance unevenness can be effectively reduced. Specifically, improvement in luminous efficiency and reduction in illuminance unevenness can be realized concurrently.

According to a preferred embodiment of the present invention, the plurality of LED chips belong to a plurality of groups connected in series to each other, and the plurality of LED chips belonging to each group are connected in parallel to each other. This configuration is suitable for making the LED chips emit light with high luminous efficiency.

In detail, the lighting device may further include a constant current power supply which supplies a current to the plurality of LED chips, and the plurality of groups may be connected in series to the constant current power supply. Accordingly, the current supplied from the constant current power supply is distributed to the plurality of LED chips connected in parallel in each group. Therefore, the drive current of each LED chip corresponds to the number of LED chips (connected in parallel) constituting each group.

Specifically, the number of LED chips (connected in parallel) in each group is preferably selected so that the drive current per one LED chip becomes not more than 40% (preferably, not more than 20%) of the rated current of this chip. More specifically, the number of LED chips (connected in parallel) in each group is preferably selected so that the drive current per one LED chip falls within a range of 20%±3% of the rated current of this chip. The number of LED chips (connected in parallel) in each group may be selected so that the drive current per one LED chip becomes not more than 8 mA (more specifically, not more than 4 mA).

According to a preferred embodiment of the present invention, the lighting device includes a plurality of LED modules each of which includes one or more of the LED chips and a pair of mounting terminals spaced from each other.

In this case, the occupied area ratio of the plurality of LED modules to the opening area is preferably not less than 20%.

According to a preferred embodiment of the present invention, each of the plurality of LED modules is disposed in a posture in which the pair of mounting terminals are spaced from each other in a first direction, and the plurality of LED modules are arrayed so as to form a plurality of rows disposed parallel to each other along a second direction perpendicular to the first direction. This configuration is advantageous for realizing uniform surface luminescence.

According to a preferred embodiment of the present invention, the plurality of LED modules are arrayed zigzag. This configuration is preferable for realizing uniform surface luminescence.

According to a preferred embodiment of the present invention, a wiring pattern is formed on the substrate. The wiring pattern includes a plurality of pad portions each of which extends in the second direction and includes an anode linear portion and a cathode linear portion disposed parallel and spaced from each other in the first direction, and an oblique joint portion which joins the anode linear portion of one of a pair of the pad portions and the cathode linear portion of the other of the pair of the pad portions. The pair of the pad portions are adjacent to each other in the second direction, and the anode linear portions and the cathode linear portions of the pair of the pad portions are disposed on the same sides in the first direction. The plurality of LED modules are mounted across the anode linear portions and the cathode linear portions.

With this configuration, the LED modules arrayed systematically in the second direction can be connected so as to belong to a plurality of groups connected in series to each other. Systematic array of the plurality of LED modules is important for obtaining uniform surface luminescence. Connection of the plurality of LED modules so that the LED modules belong to a plurality of groups connected in series to each other is advantageous for setting the current to be supplied to each LED module to a low current suitable for high-efficiency luminescence.

According to a preferred embodiment of the present invention, the wiring pattern includes anode folding portions which join the anode linear portions adjacent to each other in the first direction, and cathode folding portions which join the cathode linear portions adjacent to each other in the first direction.

According to a preferred embodiment of the present invention, the wiring pattern further includes a straight joint portion which joins the anode linear portion of one of a pair of the pad portions and the cathode linear portion of the other of the pair of the pad portions. The pair of the pad portions are adjacent to each other in the second direction, and the anode linear portions and the cathode linear portions of the pair of the pad portions are disposed on the sides opposite to each other in the first direction.

According to a preferred embodiment of the present invention, the lighting device further includes an anode electrode and a cathode electrode disposed close to one side in the second direction with respect to the plurality of pad portions. With this configuration, the anode folding portions and the cathode folding portions can be disposed to face the anode electrode and the cathode electrode. This is preferable for shortening the lengths of portions connecting the anode folding portion and the cathode folding portion to the anode electrode and the cathode electrode.

According to a preferred embodiment of the present invention, the cathode linear portions or the anode linear portions have widths overlapping the LED chips of the LED modules in a plan view. This configuration is suitable for radiating heat generated from the LED chip via the cathode linear portion or the anode linear portion.

According to a preferred embodiment of the present invention, the wiring pattern includes at least one of an anode widened portion and a cathode widened portion disposed close to an end portion of the substrate and having an external shape along an end edge of the substrate. This configuration is suitable for radiating heat generated from the LED chip via at least one of the anode widened portion and the cathode widened portion.

According to a preferred embodiment of the present invention, the wiring pattern includes a nonconductive radiation portion which is electrically nonconductive to the anode linear portions and the cathode linear portions, and positioned close to an end portion of the substrate with respect to the anode linear portions and the cathode linear portions. This configuration is suitable for increasing heat radiation performance from the substrate.

According to a preferred embodiment of the present invention, the substrate is circular, and the lighting device further includes a reflector which is formed to widen toward the end in the normal direction of the surface of the substrate on which the plurality of LED chips are mounted, and surrounds the planar light source portion, and a substrate-side opening diameter D1 on the substrate side of the reflector and an exit-side opening and the exit-side opening diameter D2 on the side opposite to the substrate of the reflector are set to satisfy $0.5 \leq D1/D2 \leq 0.69$, and a distance H between the substrate-side opening and the exit-side opening diameter D2 is set to satisfy $0.3 \leq H/D2 \leq 0.55$. This configuration is preferable for clear and uniform irradiation by the lighting device.

According to a preferred embodiment of the present invention, the mounting density of the plurality of LED chips with respect to the substrate-side opening area of the reflector is not less than $3.0/cm^2$.

According to a preferred embodiment of the present invention, the mounting density of the plurality of LED chips with respect to the substrate-side opening area of the reflector is not less than $25/cm^2$.

According to a preferred embodiment of the present invention, the mounting density of the plurality of LED chips with respect to the substrate-side opening area of the reflector is not less than $60/cm^2$.

According to a preferred embodiment of the present invention, an occupied area ratio of the plurality of LED chips to the substrate-side opening area of the reflector is not less than 30%.

According to a preferred embodiment of the present invention, an occupied area ratio of the plurality of LED modules to the substrate-side opening area of the reflector is not less than 70%.

This configuration is preferable for making the planar light source portion look like not a set of point light sources but a light-emitting surface. The configuration in which the mounting density is not less than $60/cm^2$ or the occupied area ratio is not less than 70% can be realized even when an interval of approximately 0.5 mm is secured between the LED modules, and has an advantage in which, as a so-called mounter for mounting the LED modules on the substrate, a general one can be used.

According to a preferred embodiment of the present invention, the lighting device further includes a housing made of metal which is disposed on the side opposite to the reflector with respect to the substrate and includes a bottom portion with which the substrate is in contact, and a cylindrical portion connected integrally to the bottom portion. With this configuration, heat radiation from the LED module can be promoted via the housing.

The surface of the reflector may be an uneven metal surface. This configuration is advantageous for uniformizing light from the lighting device.

A lighting device to be provided according to a second aspect of the present invention has the form of an LED lamp including a band-shaped substrate and a plurality of LED chips arrayed on the substrate. This LED lamp includes a plurality of LED modules each including one or more of the LED chips, and a pair of mounting terminals spaced from each other. The LED lamp has a shape and a size corresponding to a 40 W straight tube fluorescent lamp. The number of the plurality of LED modules is not less than 600.

According to a preferred embodiment of the present invention, each of the LED modules has a size not more than 1.0 mm×0.6 mm in a plan view.

According to a preferred embodiment of the present invention, each of the LED modules has a size not more than 1.6 mm×0.8 mm in a plan view.

According to a preferred embodiment of the present invention, each of the LED modules has a height not more than 0.2 mm.

According to a preferred embodiment of the present invention, the number of the plurality of LED modules is not less than 1000.

According to a preferred embodiment of the present invention, the number of the plurality of LED modules is not less than 4000.

According to a preferred embodiment of the present invention, the number of the plurality of LED modules is not less than 8000.

According to a preferred embodiment of the present invention, the number of the plurality of LED modules is not less than 12000.

A lighting device to be provided according to a third aspect of the present invention has the form of an LED lamp including a band-shaped substrate and a plurality of LED chips arrayed on the substrate. This LED lamp includes a plurality of LED modules each including one or more of the LED chips and a pair of mounting terminals spaced from each other. The LED lamp has a shape and a size corresponding to a 20 W straight tube fluorescent lamp. The number of the plurality of LED modules is not less than 290.

According to a preferred embodiment of the present invention, the number of the plurality of LED modules is not less than 480.

According to a preferred embodiment of the present invention, the number of the plurality of LED modules is not less than 1900.

According to a preferred embodiment of the present invention, the number of the plurality of LED modules is not less than 3900.

According to a preferred embodiment of the present invention, the number of the plurality of LED modules is not less than 5800.

A lighting device to be provided according to a fourth aspect of the present invention has the form of an LED lamp including a band-shaped substrate and a plurality of LED chips arrayed on the substrate. This LED lamp includes a plurality of LED modules each including one or more of the LED chips and a pair of mounting terminals spaced from each other. The LED lamp has a shape and a size corresponding to a 15 W straight tube fluorescent lamp. The number of the plurality of LED modules is not less than 200.

According to a preferred embodiment of the present invention, the number of the plurality of LED modules is not less than 330.

According to a preferred embodiment of the present invention, the number of the plurality of LED modules is not less than 1300.

According to a preferred embodiment of the present invention, the number of the plurality of LED modules is not less than 2700.

According to a preferred embodiment of the present invention, the number of the plurality of LED modules is not less than 4000.

A lighting device to be provided according to a fifth aspect of the present invention has the form of an LED lamp including a band-shaped substrate and a plurality of LED chips arrayed on the substrate. This LED lamp includes a plurality of LED modules each including one or more of the LED chips and a pair of mounting terminals spaced from each other. The LED lamp has a shape and a size corresponding to a 10 W straight tube fluorescent lamp. The number of the plurality of LED modules is not less than 150.

According to a preferred embodiment of the present invention, the number of the plurality of LED modules is not less than 250.

According to a preferred embodiment of the present invention, the number of the plurality of LED modules is not less than 1000.

According to a preferred embodiment of the present invention, the number of the plurality of LED modules is not less than 2000.

According to a preferred embodiment of the present invention, the number of the plurality of LED modules is not less than 3000.

According to a preferred embodiment of the present invention, each of the LED modules has a size not more than 1.0 mm×0.6 mm in a plan view.

According to a preferred embodiment of the present invention, each of the LED modules has a size not more than 1.6 mm×0.8 mm in a plan view.

According to a preferred embodiment of the present invention, each of the LED modules has a height not more than 0.2 mm.

An LED lamp to be provided according to a sixth aspect of the present invention has the form of an LED lamp including a band-shaped substrate and a plurality of LED chips arrayed on the substrate. This LED lamp includes a plurality of LED modules each including one or more of the LED chips and a pair of mounting terminals spaced from each other. The mounting density of the plurality of LED modules with respect to the area of the substrate is not less than 3.0/cm$^2$.

According to a preferred embodiment of the present invention, the mounting density of the plurality of LED modules with respect to the area of the substrate is not less than 5.0/cm$^2$.

According to a preferred embodiment of the present invention, the mounting density of the plurality of LED modules with respect to the area of the substrate is not less than 20/cm$^2$.

According to a preferred embodiment of the present invention, the mounting density of the plurality of LED modules with respect to the area of the substrate is not less than 40/cm$^2$.

According to a preferred embodiment of the present invention, the mounting density of the plurality of LED modules with respect to the area of the substrate is not less than 60/cm$^2$.

According to a preferred embodiment of the present invention, the number of the plurality of LED modules mounted in the width direction of the substrate is not less than 3.

According to a preferred embodiment of the present invention, the mounting density of the plurality of LED modules in the longitudinal direction of the substrate is larger than the mounting density of the plurality of LED modules in the width direction of the substrate.

According to a preferred embodiment of the present invention, each of the LED modules has a size not more than 1.0 mm×0.6 mm in a plan view.

According to a preferred embodiment of the present invention, each of the LED modules has a size not more than 1.6 mm×0.8 mm in a plan view.

According to a preferred embodiment of the present invention, each of the LED modules has a height not more than 0.2 mm.

A lighting device to be provided according to a seventh aspect of the present invention has the form of an LED lamp including a band-shaped substrate and a plurality of LED chips arrayed on the substrate. This LED lamp includes a plurality of LED modules each including one or more of the LED chips and a pair of mounting terminals spaced from each other. The occupied area ratio of the plurality of LED modules with respect to the area of the substrate is not less than 20%, and each of the LED modules has a size not more than 4.0 mm×2.0 mm in a plan view.

A lighting device to be provided according to an eighth aspect of the present invention has the form of an LED lamp including a band-shaped substrate and a plurality of LED chips arrayed on the substrate. This LED lamp includes a plurality of LED modules each including one or more of the LED chips and a pair of mounting terminals spaced from each other. The occupied area ratio of the plurality of LED modules with respect to the area of the substrate is not less than 30%.

According to a preferred embodiment of the present invention, the occupied area ratio of the plurality of LED modules to the area of the substrate is not less than 35%.

According to a preferred embodiment of the present invention, the occupied area ratio of the plurality of LED modules to the area of the substrate is not less than 45%.

According to a preferred embodiment of the present invention, the occupied area ratio of the plurality of LED modules to the area of the substrate is not less than 70%.

According to a preferred embodiment of the present invention, each of the LED modules has a size not more than 1.0 mm×0.6 mm in a plan view.

According to a preferred embodiment of the present invention, each of the LED modules has a size not more than 1.6 mm×0.8 mm in a plan view.

According to a preferred embodiment of the present invention, each of the LED modules has a height not more than 0.2 mm.

According to a preferred embodiment of the present invention, the occupation ratio of the plurality of LED modules in the longitudinal direction of the substrate is larger than the occupation ratio of the plurality of LED modules in the width direction of the substrate.

According to a preferred embodiment of the present invention, the plurality of LED modules include LED modules which emit light different in wavelength from each other.

According to a preferred embodiment of the present invention, the plurality of LED modules include a plurality of LED modules which emit white light and a plurality of LED modules which are arrayed discretely and emit red light, and whose proportion to the total is smaller than that of the plurality of LED modules that emit white light.

According to a preferred embodiment of the present invention, a current flowing in each of the LED chips is not more than 20% of a rated current of the LED chip.

A lighting device to be provided according to a ninth aspect of the present invention has the form of an LED lamp including a band-shaped substrate and a planar light source portion including a plurality of LED chips arrayed on the substrate.

According to a preferred embodiment of the present invention, the lighting device further includes a case having a circular tubular sectional shape for housing the substrate.

According to a preferred embodiment of the present invention, the plurality of LED chips belong to a plurality of groups connected in series to each other, and the plurality of LED chips belonging to each group are connected in parallel to each other.

According to a preferred embodiment of the present invention, the lighting device includes a plurality of LED modules each including one or more of the LED chips and a pair of mounting terminals spaced from each other. Each of the plurality of LED modules is disposed in a posture in which the pair of mounting terminals are spaced from each other in the width direction of the substrate, and the plurality of LED modules are arrayed so as to form a plurality of rows disposed parallel to each other along the longitudinal direction of the substrate.

According to a preferred embodiment of the present invention, the plurality of LED modules are arrayed zigzag.

According to a preferred embodiment of the present invention, the substrate is a flexible wiring substrate having flexibility and including a laminated resin layer and a metal wiring layer, and has a circular or arc sectional shape.

According to a preferred embodiment of the present invention, the case has a straight tube shape, a pair of projecting pieces projecting inward within a plane parallel to a central axis of the case are formed integrally with the case, and the substrate is restricted from moving radially with respect to the case by the projecting pieces.

With this configuration, light emitted from the plurality of LED chips (or the plurality of LED modules) looks like not light from point light sources but planar light to the naked eye. Therefore, to this planar light, it is not necessary to apply, for example, diffusion to an extent so as to make light from a plurality of point light sources look like light from a planar light source. Therefore, improper attenuation of light from the LED lamp can be avoided, and the luminous efficiency of the LED lamp can be increased. As the mounted number of the plurality of LED chips is increased, the current value to be supplied to each LED chip can be relatively reduced. This is advantageous for reducing the ratio of energy to be consumed for heat generation to the energy supplied to the LED chips, and suitable for increasing the luminous efficiency of the LED lamp.

Other features and advantages of the present invention will be clarified from the detailed description given below with reference to the accompanying drawings.

BRIEF DESCRIPTION OF THE DRAWINGS

FIG. 18D is a diagram showing relative illuminance distributions when using reflectors of various sizes.

MODES FOR CARRYING OUT THE INVENTION

Figure 1:
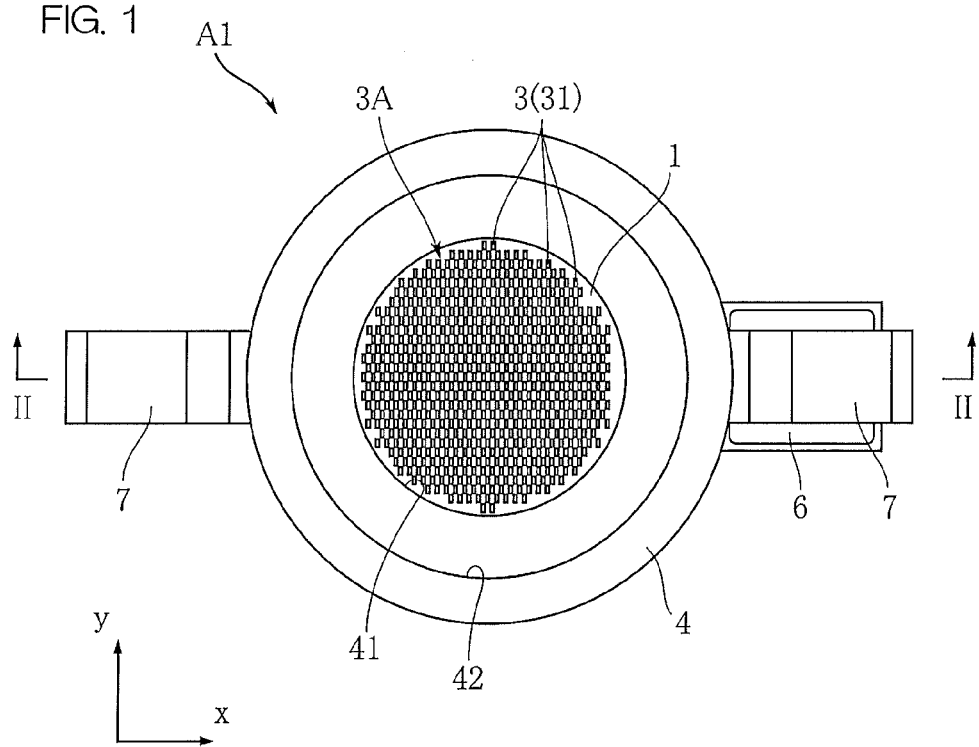
FIG. 1 is a plan view showing a lighting device based on a first preferred embodiment of the present invention.
Figure 2:
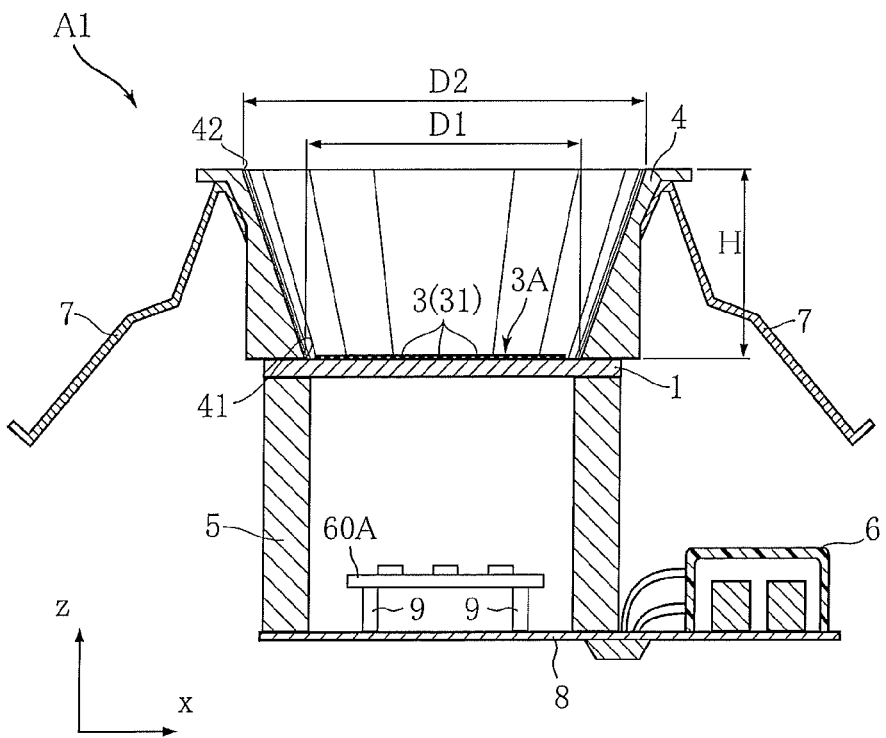
FIG. 2 is a sectional view taken along line II-II of FIG. 1.

FIG. 1 and FIG. 2 show a lighting device according to a first preferred embodiment of the present invention. The lighting device A1 of the present preferred embodiment includes a substrate 1, a plurality of LED modules 3, a reflector 4, a housing 5, a connector 6, and a holder 7. The lighting device A1 may be used as a so-called downlight by being installed in an opening space provided on a ceiling with an upside down position in the z direction of FIG. 2.

The substrate 1 is, for example, an aluminum plate the surface of which is insulated, and is for mounting a plurality of LED modules 3. In the present preferred embodiment, the substrate 1 is circular, and has a diameter of approximately 66 mm. The region in which the plurality of LED modules 3 are mounted is a circular region with a diameter of approximately 50 to 60 mm.

Figure 3:
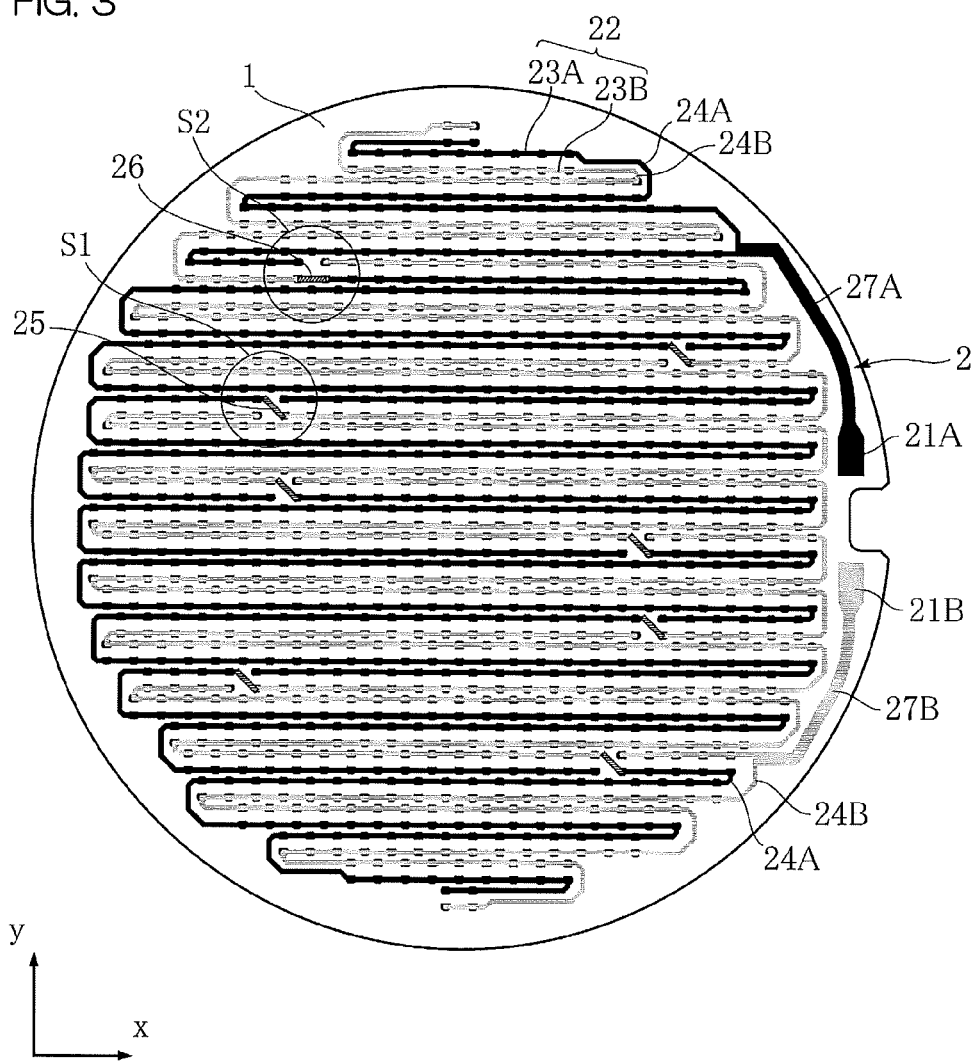
FIG. 3 is a plan view showing a substrate and a wiring pattern of the lighting device shown in FIG. 1.

As shown in FIG. 3, on the substrate 1, a wiring pattern 2 is formed. The wiring pattern 2 is made of a metal film of, for example, copper, and is for mounting a plurality of LED modules 3 and supplying electric power thereto. The wiring pattern 2 includes an anode electrode 21A, a cathode electrode 21B, a plurality of pad portions 22, a plurality of anode folding portions 24A, a plurality of cathode folding portions 24B, a plurality of oblique joint portions 25, a straight joint portion 26, an anode connecting portion 27A, and a cathode connecting portion 27B. In the wiring pattern 2, portions other than the portions for mounting the LED modules 3 are covered by an insulating layer (not shown) with high reflectance, for example, white resist.

The anode electrode 21A and the cathode electrode 21B are for connecting an electric wire (not shown) extending from a connector 6, and are disposed close to one side in the x direction of the substrate 1.

The plurality of pad portions 22 are portions on which the plurality of LED modules 3 are mounted. The pad portions 22 include an anode linear portion 23A (black in the drawing) and a cathode linear portion 23B (gray in the drawing). The anode linear portion 23A and the cathode linear portion 23B extend in the x direction, and are disposed parallel to each other at intervals in the y direction which is orthogonal to the x direction. Accordingly, all of the plurality of pad portions 22 extend along the x direction. Most of the plurality of pad portions 22 are disposed parallel to each other at intervals in the y direction. Further, some pad portions 22 are disposed in series at intervals in the x direction.

Figure 4:
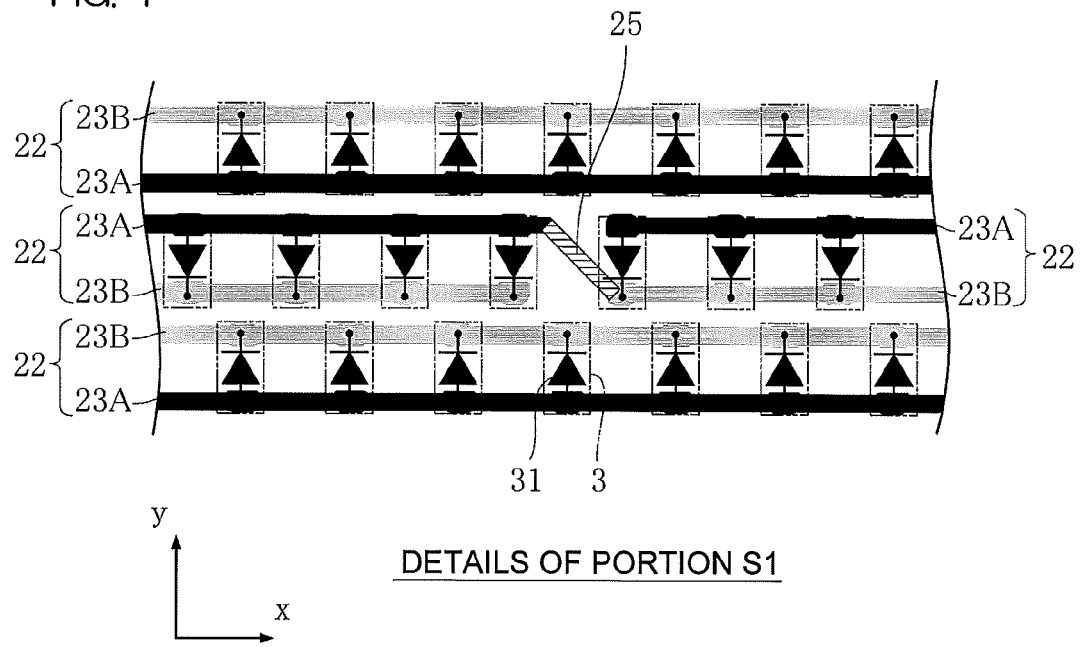
FIG. 4 is an enlarged plan view showing a portion S1 of FIG. 3.
Figure 6:
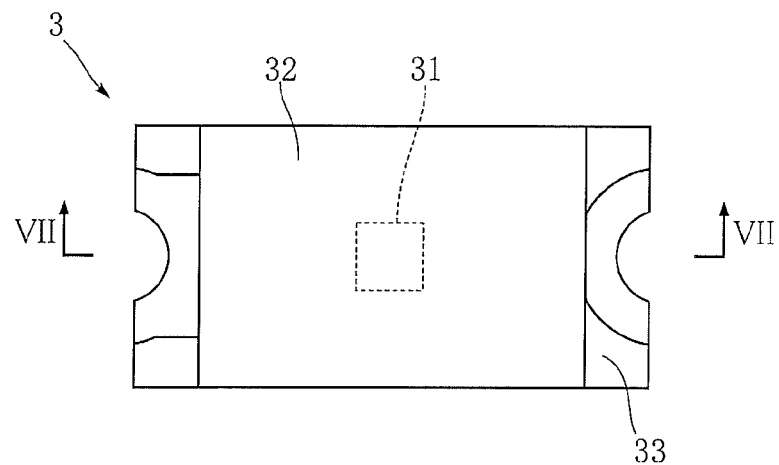
FIG. 6 is a plan view showing an LED module to be used in the lighting device shown in FIG. 1.
Figure 7:
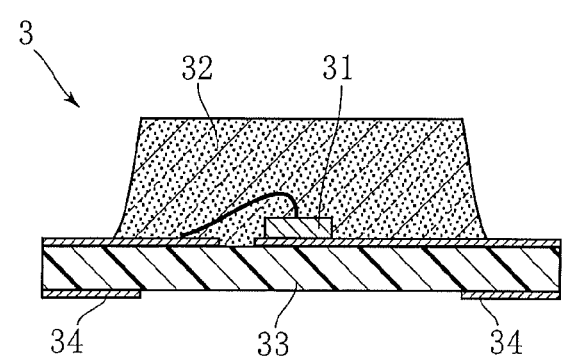
FIG. 7 is a sectional view taken along line VII-VII of FIG. 6.
Figure 8:
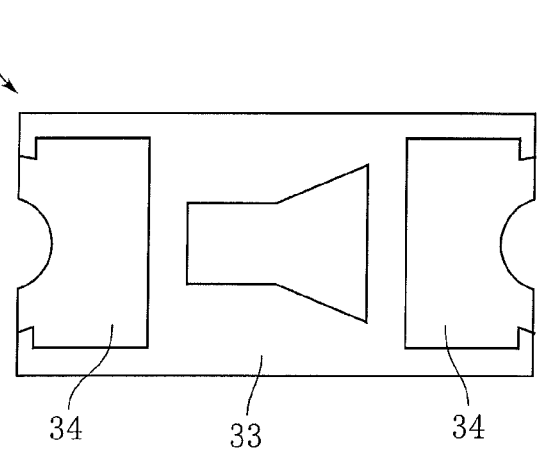
FIG. 8 is a bottom view showing an LED module to be used in the lighting device shown in FIG. 1.

FIG. 4 is a detailed view of the portion S1 of FIG. 3. On each pad portion 22, a plurality of LED modules 3 are mounted. The LED module 3 includes an LED chip 31, a resin package 32, a substrate 33, and a pair of mounting terminals 34 as shown in FIG. 6 to FIG. 8. The LED module 3 has approximately a width of 0.8 mm, a length of 1.6 mm, and a thickness of 0.5 mm, and is configured as a small-sized and very-thin LED module.

The substrate 33 is an insulating substrate which has a substantially rectangular shape in a plan view, and is made of, for example, glass epoxy resin. On the surface of the substrate 33, an LED chip 31 is mounted. On the back surface of the substrate 33, a pair of mounting terminals 34 are formed. The thickness of the substrate 33 is set to approximately 0.08 mm to 0.1 mm. The LED chip 31 is a light source of the LED module 3, and capable of emitting, for example, visible light. The resin package 32 is for protecting the LED chip 31. The resin package 32 is molded by using, for example, an epoxy resin having translucency for light generated by the LED chip 31 or a translucent resin containing a fluorescent material which is excited by the light from the LED chip 31 to emit light with a different wavelength. For example, by mixing blue light from the LED chip 31 and yellow light from the fluorescent material contained in the resin package 32, the LED module 3 can irradiate white light. Instead of the fluorescent material that emits yellow light, a fluorescent material that emits red light and a fluorescent material that emits green light may be mixed and used.

The LED module 3 is mounted on the pad portion 22 by, for example, soldering one of the pair of mounting terminals 34 to the anode linear portion 23A and the other mounting terminal to the cathode linear portion 23B. Accordingly, the plurality of LED modules 3 mounted on one pad portions 22 are connected in parallel to each other.

In the portion S1 shown in FIG. 4, two groups consisting of a plurality of LED modules 3 connected in parallel are disposed across the oblique joint portion 25. Two pad portions 22 disposed on both sides of the oblique joint portion 25 have the same disposition of the anode linear portion 23A and the cathode linear portion 23B in the y direction. The oblique joint portion 25 joins the anode linear portion 23A of one of the pad portions 22 and the cathode linear portion 23B of the other pad portion 22. Accordingly, the plurality of LED modules 3 belonging to these two groups are connected in series to each other.

Figure 5:
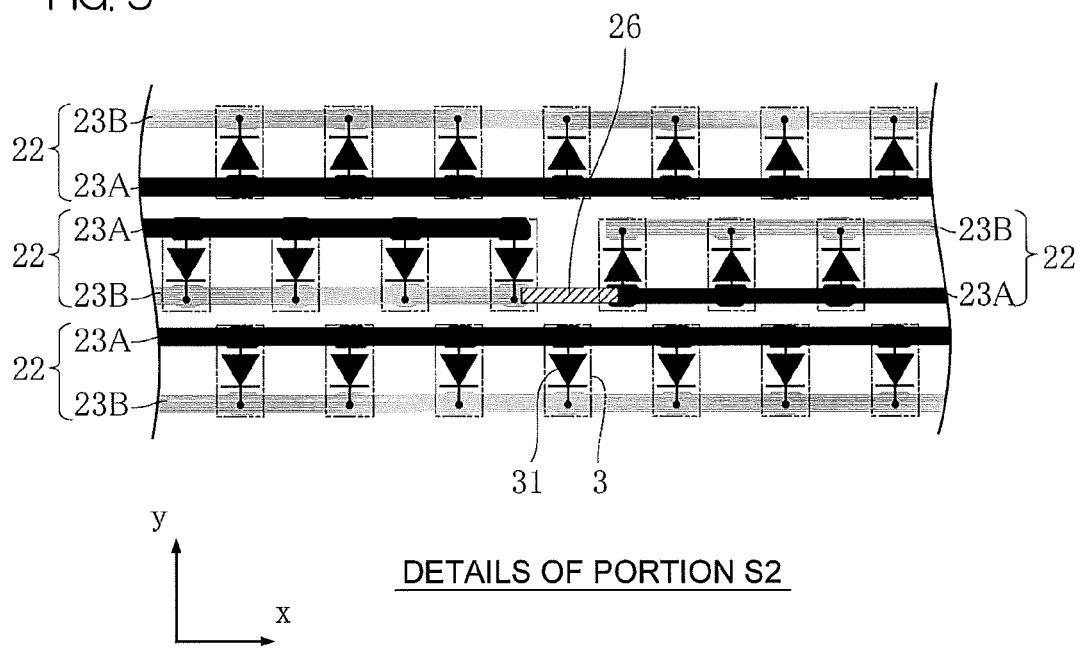
FIG. 5 is an enlarged plan view showing a portion S2 of FIG. 3.

In the portion S2 shown in FIG. 5, two groups consisting of a plurality of LED modules 3 connected in parallel to each other are disposed across a straight joint portion 26. The two pad portions 22 disposed on both sides of the straight joint portion 26 have dispositions of the anode linear portions 23A and cathode linear portions 23B inverse to each other in the y direction. The straight joint portion 26 joins the anode linear portion 23A of one of the pad portions 22 and the cathode linear portion 23B of the other pad portion 22. Accordingly, the plurality of LED modules 3 belonging to these two groups are connected in series to each other.

As shown in FIG. 3, pad portions 22 adjacent to each other in the y direction of the plurality of pad portions 22 are connected by the anode folding portion 24A and the cathode folding portion 24B. More specifically, the anode folding portion 24A joins anode linear portions 23B adjacent to each other in the y direction. The cathode folding portion 24B joins cathode linear portions 23 adjacent to each other in the y direction.

Figure 9:
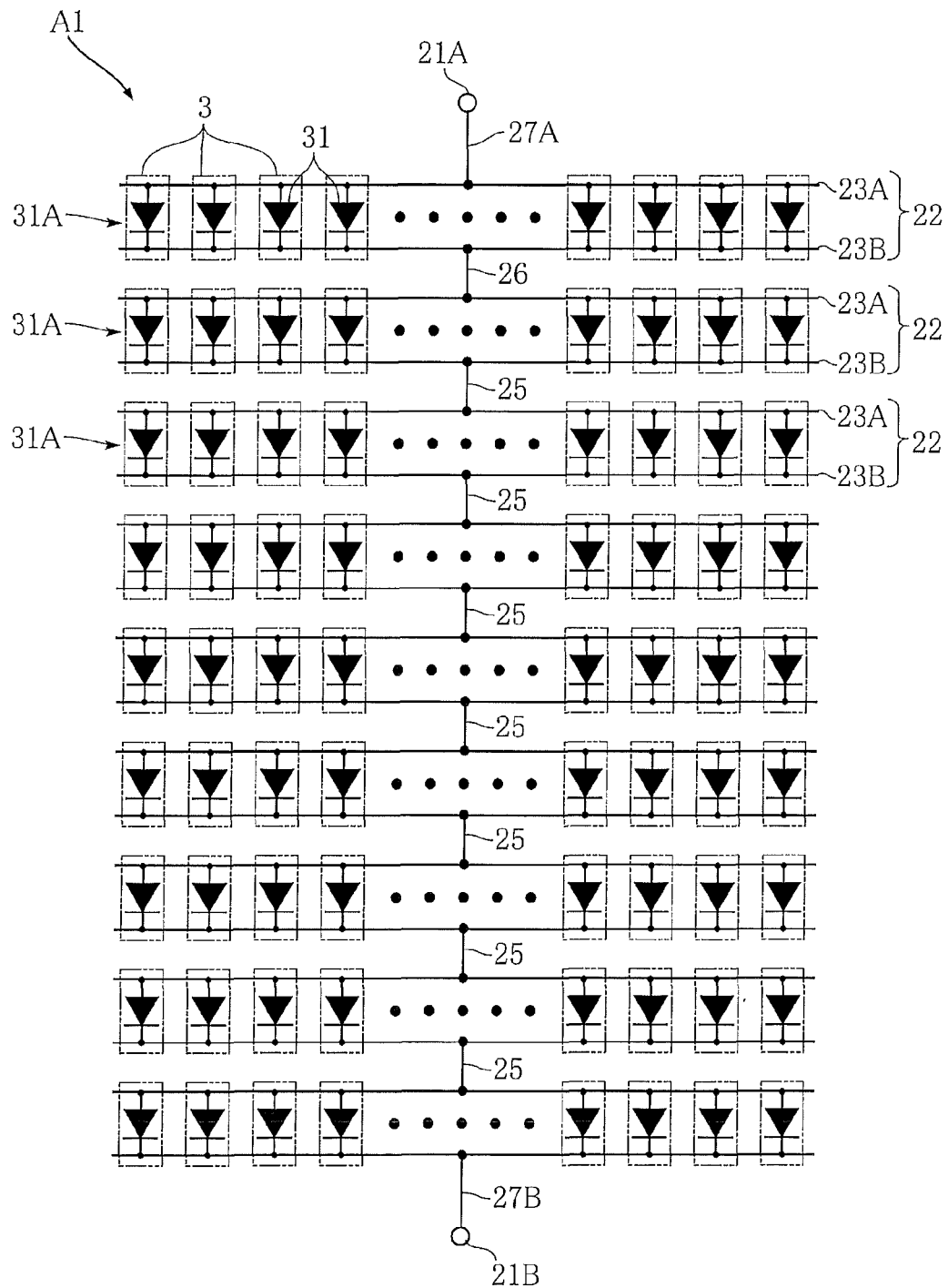
FIG. 9 is a circuit diagram showing the lighting device shown in FIG. 1.

In the path from the anode electrode 21A to the cathode electrode 21B, a plurality of pad portions 22 and, in order from the anode electrode 21A side, one straight joint portion 26 and seven oblique joint portions 25 are disposed. Accordingly, the plurality of LED modules 3, that is, the plurality of LED chips 31 are connected as shown in FIG. 9. In the present preferred embodiment, 603 LED modules 3 (LED chips 31) are used. These LED modules 3 are divided into nine groups 31A. The group 31A includes 67 LED modules 3 connected in parallel to each other. These nine groups 31A are connected in series to each other by one straight joint portion 26 and seven oblique joint portions 25.

In the present preferred embodiment, 603 LED modules 3 are arrayed zigzag on the substrate 1. As power supply specifications for making the plurality of LED modules 3 emit light, the voltage between the anode electrode 21A and the cathode electrode 21B is approximately 27V, the voltage Vf of each LED module 3 is approximately 3.0V, and the current If is approximately 4.0 mA. When the plurality of LED modules 3 mounted at a high density emit light, the light looks like not a set of a plurality of point light sources but surface luminescence to the naked eye. Specifically, the region in which the plurality of LED modules 3 are mounted forms a planar light source portion 3A.

As shown in FIG. 3, in the region of approximately ⅔ from the lower end of the substrate 1, a plurality of anode folding portions 24A are positioned on the left side, and a plurality of cathode folding portions 24B are positioned on the right side. From the portion where the straight joint portion 26 is provided, in the region of approximately ⅓ from the upper end of the substrate 1, a plurality of anode folding portions 24A are positioned on the right side, and a plurality of cathode folding portions 24B are positioned on the left side. The anode connecting portion 27A connects the anode electrode 21A and the anode folding portion 24A on the upper right portion of the substrate 1. The cathode connecting portion 27B connects the cathode electrode 21B and the cathode folding portion 24B on the lower right portion of the substrate 1.

As shown in FIG. 1 and FIG. 2, the reflector 4 has a cone shape which has openings 41 and 42 and a sectional size that becomes larger with increasing distance from the substrate 1, and is made of, for example, aluminum. The reflector 4 surrounds a plurality of LED modules 4, and reflects light emitted from the LED modules toward the z direction. In the present preferred embodiment, the diameter D1 of the opening 41 is 60 mm, the diameter D2 of the opening 42 is 100 mm, and the distance H is 50 mm. In addition, even with a configuration in which the diameter D1 is 52 mm to 62 mm, the diameter D2 is 90 mm, and the distance H is approximately 40 mm, preferable irradiation is also realized. The inner surface of the reflector 4 is, for example, an uneven Al-plated surface.

The planar light source portion 3A faces a space to be illuminated (illumination space) through the opening 41. In the present preferred embodiment, the mounting density of the plurality of LED modules 3 per unit area of the opening 41 is set to 3 1/cm². This mounting density is approximately 39% in terms of a ratio of the occupied area of the plurality of LED modules 3 to the area of the opening 41.

The housing 5 is made of, for example, aluminum, and supports the substrate 1 and the reflector 4. When the LED modules 3 emit light, heat from the LED modules 3 is transmitted to the reflector 4 and the housing 5 via the substrate 1. Accordingly, heat radiation of the LED modules 3 is enhanced. The connector 6 is connected to a connector (not shown) of a building side when the lighting device A1 is mounted on a ceiling. A holder 7 is formed by bending, for example, a stainless-steel (SUS301) plate. The holder 7 engages with a part of the ceiling to hold the lighting device A1 when the lighting device A1 is attached to the ceiling.

Inside the housing 5, a power supply substrate 60A forming a power supply unit is housed. The power supply substrate 60A is supported at a distance from a support substrate 8 by columnar supports 9 and 9 made of a resin erected inside the housing 5 from the support substrate 8. The support substrate 8 is fixed to the housing 5 on the side opposite to the substrate 1. The connector 6 is attached to the support substrate 1 outside the housing 5 on the same side as the housing 5.

Figure 10:
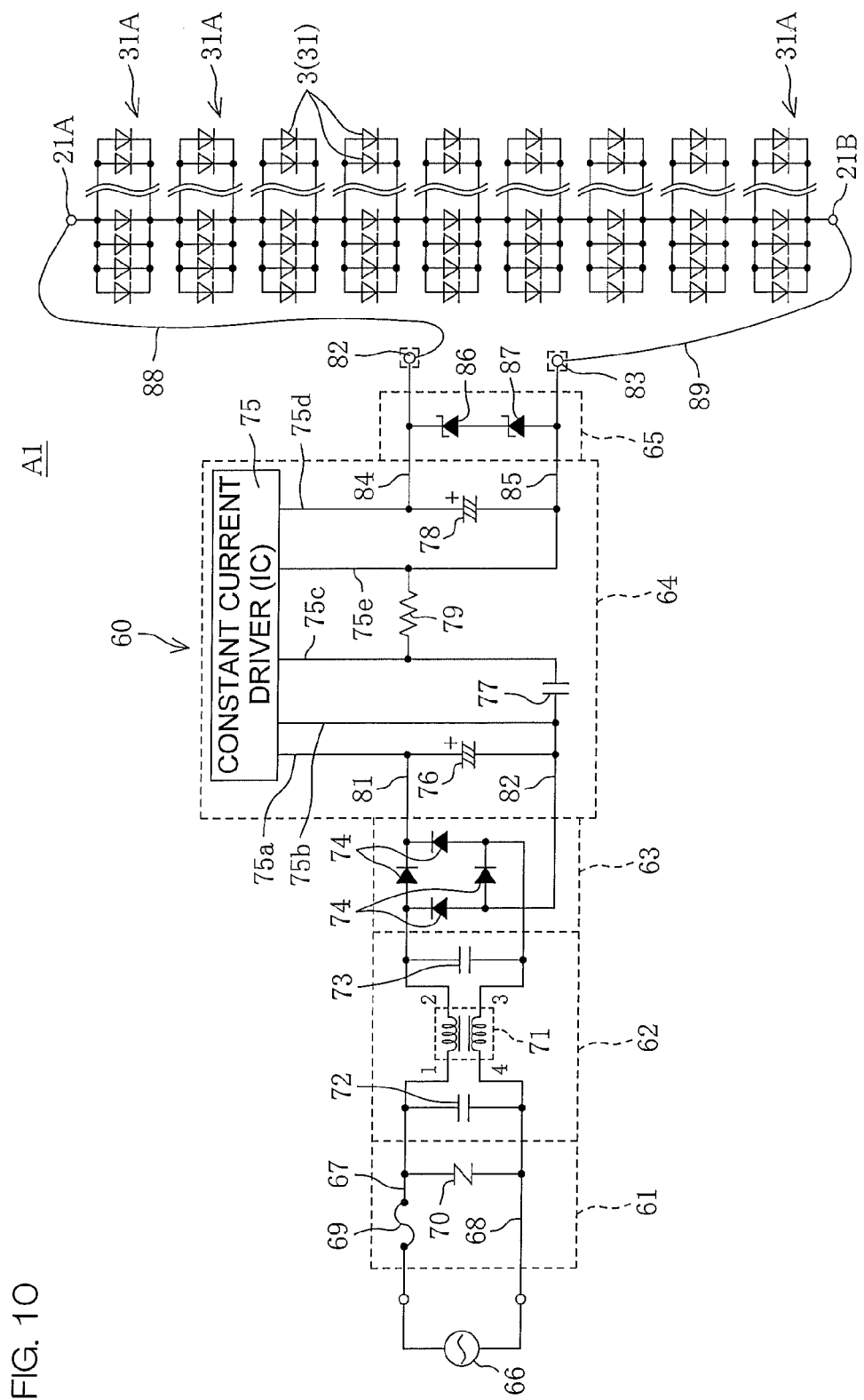
FIG. 10 is a circuit diagram for describing a configuration of a power supply unit.

FIG. 10 is an electric circuit diagram for describing an electrical configuration of the lighting device A1. A series circuit of the plurality of LED groups 31A is connected to the power supply unit 60 serving as a constant current power supply. The power supply unit 60 includes a surge protection circuit 61, a filter circuit 62, a rectifying circuit 63, a control circuit 64, and a reverse voltage protection circuit 65.

The surge protection circuit 61 includes a fuse 69 interposed in one of a pair of power feeders 67 and 68 to be connected to a commercial AC power supply 66, and a varistor 70 connected between the power feeders 67 and 68. With this configuration, the power supply unit 60 is protected from a lightning surge, etc.

The filter circuit 62 includes an inductor 71 interposed between the power feeders 67 and 68 and capacitors 72 and 73 connected between the power feeders 67 and 68 on both sides of the inductor 71. With this configuration, filtering for removing noise transmitted from the AC power supply is performed.

The rectifying circuit 63 is configured by bridge-connecting four diodes 74. With this configuration, the rectifying circuit 63 performs full-wave rectification of an alternating current from the power feeders 67 and 68.

The control circuit 64 includes a constant current driver 75 consisting of an integrated circuit (IC), smoothing capacitors 76 to 78, and a current setting resistor element 79. To power supply terminals 75a and 75b of the constant current driver 75, electric power is supplied from the rectifying circuit 63 via DC power feeders 80 and 81. Between these DC power feeders 80 and 81, the smoothing capacitor 76 is connected. This smoothing capacitor 76 smoothes an input voltage to be input into the constant current driver 75. Between one of the DC power feeders 82 and the control terminal 75c of the constant current driver 75, the smoothing capacitor 77 is connected. This smoothing capacitor 77 has a function to smooth the voltage inside the constant current driver 75. On the other hand, between output terminals 75d and 75e of the constant current driver 75 and a pair of output terminals 82 and 83 of the control circuit 64, a pair of output lines 84 and 85 are connected, respectively. Between these output lines 84 and 85, the smoothing capacitor 78 is connected. This smoothing capacitor 78 smoothes the output voltage of the constant current driver 75. Between the output terminal 75e (output line 85) on the negative terminal side and the control terminal 75c, the current setting resistor element 79 is connected. The constant current driver 75 operates so that a constant current corresponding to a resistance value of the current setting resistor element 79 flows between the output terminals 75d and 75e. Therefore, a resistor element with a proper resistance value is selected according to a necessary current value and connected as the current setting resistor element 79.

The reverse voltage protection circuit 65 includes a pair of zener diodes 86 and 87 connected in series between the output lines 84 and 85. When a reverse voltage is applied between the output lines 84 and 85, the reverse voltage protection circuit 65 prevents the reverse voltage from being applied to the LED modules 3, and accordingly protects the LED modules 3 from breakage.

Between the output terminals 82 and 83, a series circuit of the plurality of LED groups 31A is connected via lead wires 88 and 89. The plurality of LED modules 3 constituting each LED group 31A are connected in parallel to the power supply unit 60. Therefore, a current controlled to a constant current which is supplied from the power supply unit 60 is distributed to the plurality of LED modules 3 constituting each group 31A. Accordingly, a current (drive current) flowing in each LED module 3 is determined according to a current value supplied by the power supply unit 60 and the number of LED modules 3 (connected in parallel) in each group 31A. Therefore, the resistance value of the current setting resistor element 79 and the number of LED modules 3 (connected in parallel) constituting each group 31A are designed so that the drive current of each LED module 3 has a desired value (for example, 4 mA).

Next, operations of the lighting device A1 will be described.

According to the present preferred embodiment, light is emitted from the planar light source portion 3A constituted by the plurality of LED modules 3. Light emitted from the planar light source portion 3A advances mainly in the normal direction of the surface of the substrate 1, and does not advance in various directions. Therefore, as compared with a downlight including a point light source typified by, for example, a halogen lamp, the reflector 4 for directing light toward a predetermined range can be made smaller. Therefore, the lighting device A1 can be downsized, and the mounting space on the ceiling to which the lighting device A1 is attached can be saved. Zigzag array of the LED modules 3 is suitable for obtaining uniform surface luminescence.

The current If flowing in each LED module 3 (LED chip 31) is a comparatively low current of approximately 4.0 mA. When driving the LED module 3 with such a low current If, the luminous efficiency thereof reaches a little less than 70 Lm/W. As a result, when electric power of 7.0 W is supplied, even if inevitable absorption and light leakage of the lighting device A1 causes loss, the lighting device A1 realizes brightness of 413 Lm. The luminous efficiency in this case is 59 Lm/W, and is much higher than that of a light source using a filament such as a halogen lamp, so that dramatic power-savings are realized.

Figure 11:
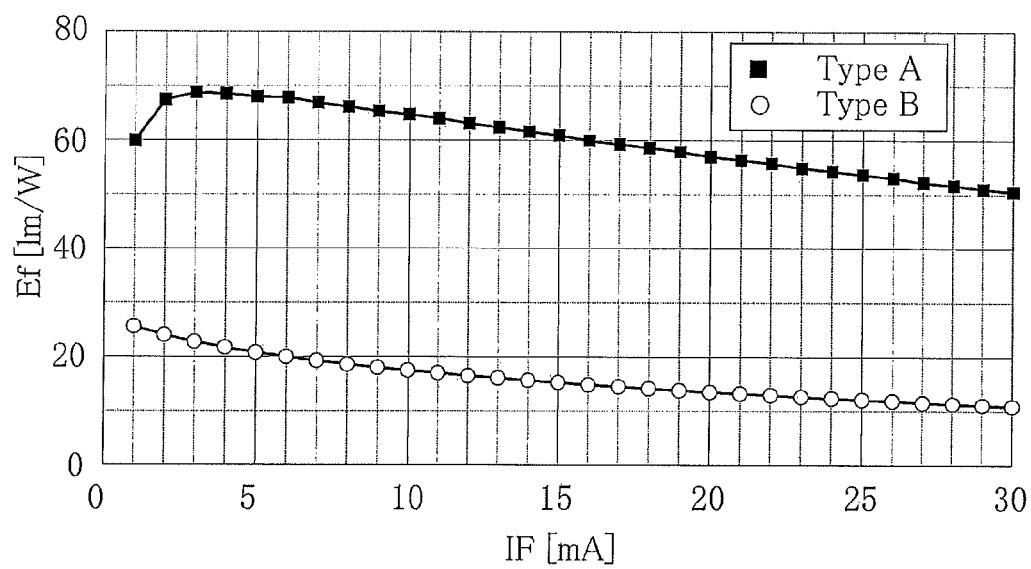
FIG. 11 is a graph showing relationships between a current and luminous efficiencies of the LED modules to be used in the lighting device shown in FIG. 1.

FIG. 11 shows a relationship between a current If flowing in one LED module 3 and luminous efficiency Ef. The LED module 3 of the present preferred embodiment is equivalent to Type A of this drawing. The relationship shown in FIG. 11 indicates that excellent luminous efficiency Ef is obtained in the range of 2 mA to 8 mA (more preferably, 2 mA to 4 mA) of the current If flowing in the LED module 3. Particularly, when the current If is 4 mA, the LED module 3 can be made to emit light with the highest luminous efficiency. The rated current of the LED module 3 is approximately 20 mA, so that in order to realize high-efficiency luminescence, the current If is set to 10% to 40% of the rated current (If=2 mA to 8 mA). Further, by setting the current If to 20%±3% (If=4 mA), the efficiency of a single LED module 3 becomes maximum.

On the other hand, results of investigation on the luminous efficiency, etc., as a whole of the lighting device A1 are shown in the following Table 1.

TABLE 1

| Trial product example | Number of LEDs | Current mA | Power consumption W | Illuminance at 1 m | Lx/W | Illuminance unevenness |
|---|---|---|---|---|---|---|
| A | 603 | 4.0 | 7.9 | 412.1 | 52.2 | 2% |
| B | 302 | 8.0 | 7.9 | 410.6 | 52.0 | 5% |
| C | 153 | 16.0 | 7.9 | 379.5 | 48.0 | 12% |
| D | 117 | 20.8 | 7.9 | 361.9 | 45.8 | 21% |

The trial product example A has the above-described configuration in which 603 LED modules 3 are mounted on the substrate 1. The trial product example B is configured such that 302 LED modules 3 are mounted on the substrate 1 by omitting every other LED modules 3 from the trial product example A. In this case, the number of LED modules 3 (connected in parallel) constituting each LED group 31A is reduced to approximately half, and accordingly, the drive current in each LED module 3 becomes twice (8 mA) the drive current of 4 mA of the trial product example A. In detail, by connecting a total of 9 groups including five groups 31A each consisting of 34 LED modules 3 and four groups each consisting of 33 LED modules 3 in series, a total of 302 LED modules 3 are used. Of course, other omitting methods can also be used, and it is also possible that, for example, a total of 306 LED modules 3 may be used by connecting nine groups each consisting of 34 LED modules 3 in series.

The trial product example C has a configuration in which 153 LED modules 3 are mounted on the substrate 1 by further omitting every other LED modules 3 from the trial product example B. In this case, the number of LED modules 3 (connected in parallel) constituting each LED group 31A is reduced to approximately ¼ of that in the case of the trial product example A, and accordingly, the drive current in each LED module 3 is 16 mA that is four times the drive current in the case of the trial product example A. The trial product example D is configured such that the number of LED modules 3 is reduced to ⅕ by uniformly omitting LED modules 3 from the trial product example A. In this case, the number of LED modules 3 constituting each LED group 31A is reduced to approximately ⅕ of that in the case of the trial product example A, and accordingly, the drive current in each LED module 3 is 20.8 mA that is approximately five times the drive current in the case of the trial product example A.

"Power consumption" is power consumption of all LED modules 3. "Illuminance at 1 m" is an illuminance (Lx) measured at a distance of 1 m from the exit-side opening 42 of the reflector 4 in the normal direction of the substrate 1. "Lx/W" is a value obtained by dividing the illuminance at 1 m by the power consumption, and corresponds to luminous efficiency of the entire lighting device. "Illuminance unevenness" means the degree of illuminance distribution unevenness.

Figure 12:
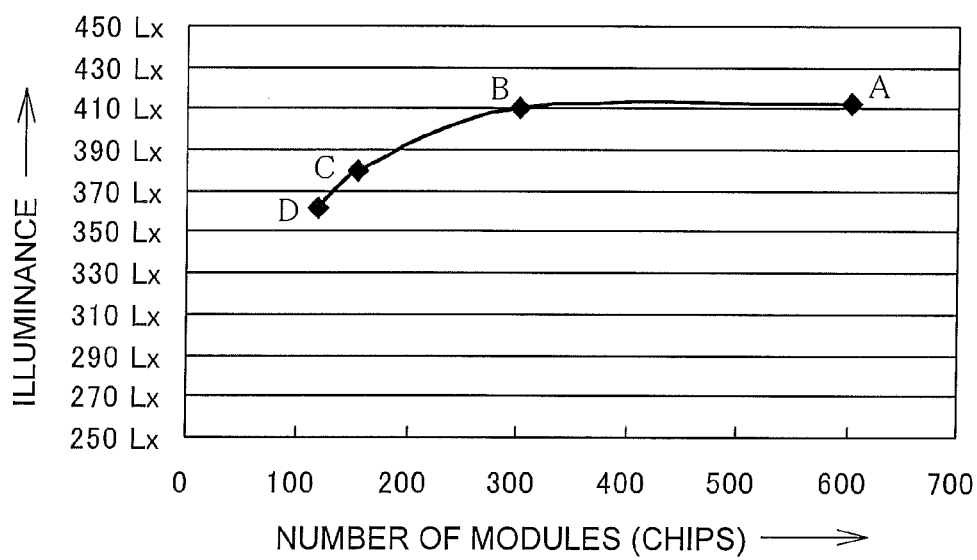
FIG. 12 is a diagram showing a relationship between the number of LED modules and illuminance.

The relationship between the number of LED modules 3 and the illuminance is shown in FIG. 12. This drawing and Table 1 shown above indicates that there is no substantial difference in illuminance between the trial product examples A and B. Further, in Table 1, no significant difference in luminous efficiency is found between the trial product examples A and B. Therefore, the trial product example A is more advantageous in the luminous efficiency of each LED module 3; however, there are no differences in the illuminance and the luminous efficiency of the entirety, so that the trial product example B including the smaller number of LED modules 3 is more advantageous because its cost and number of manufacturing processes are smaller.

Figure 13:
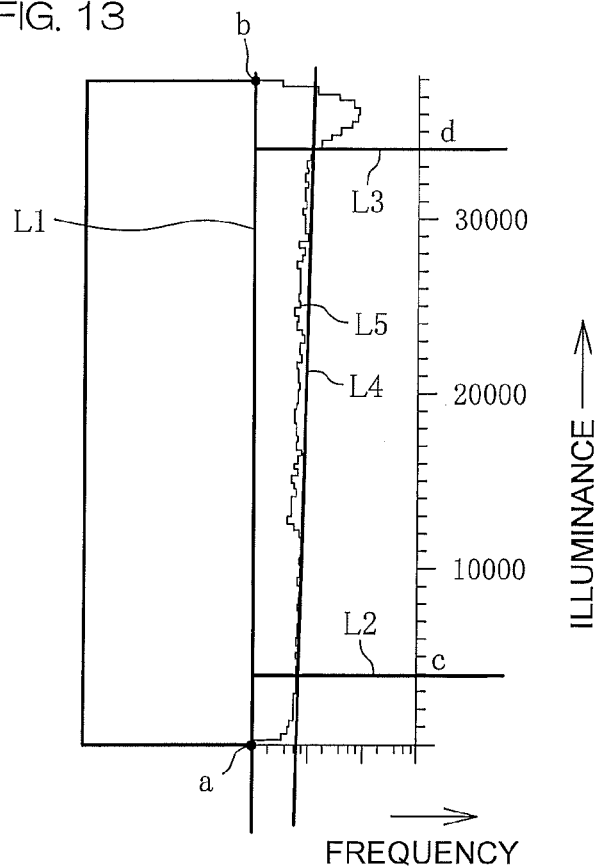
FIG. 13 is a view for describing an illuminance unevenness calculation method.

FIG. 13 is a view for describing a method for obtaining the illuminance unevenness, and shows an illuminance histogram. Steps for obtaining the illuminance unevenness are as follows. First, the illuminance is measured at a plurality of different positions on a 3 m-square light receiving surface (surface perpendicular to the normal direction of the substrate 1) centered at a position at a distance of 1 m from the exit-side opening 42 of the reflector 4 in the normal direction of the substrate 1. Next, a frequency distribution of the illuminance values is obtained, and the histogram as shown in FIG. 13 is prepared. Then, a straight line L1 connecting the lowest frequency position a and the second lowest frequency position b is obtained. There is a large amount of noise around the illuminance upper limit and the illuminance lower limit, so that straight lines L2 and L3 for excluding the range lower than a predetermined lower limit threshold c and a range higher than an upper limit threshold d are obtained. Further, in the illuminance section between the straight lines L2 and L3, a straight line L4 circumscribed about a frequency distribution curve L5 is obtained. Accordingly, a quadrilateral surrounded by the straight lines L1 to L4 is obtained. An area (reference area) Sref of this quadrilateral is obtained. Next, an area (illuminance unevenness area) Su between the straight line L4 and the frequency distribution curve L5 is obtained. A ratio of the illuminance unevenness area Su to the reference area Sref is expressed as illuminance unevenness (%) by percentage (=(Su/Sref)×100).

Figure 14:
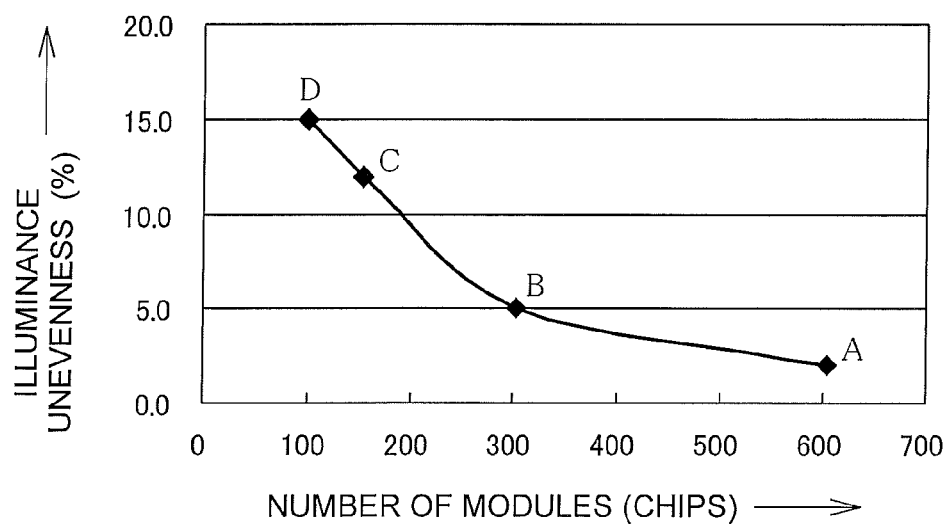
FIG. 14 is a diagram showing a relationship between the number of LED modules and illuminance.

The relationship between the number of LED modules 3 and the illuminance unevenness is shown in FIG. 14. In the trial product example A and the trial product example B, the illuminance unevenness is not more than 5%; however, in the trial product examples C and D, the illuminance unevenness is over 10%. In the case where the illuminance unevenness is great, when an object is near the lighting device A1, a shading pattern such as stripes is observed on the object surface. In detail, when a downlight is mounted on the ceiling near a wall surface, a shading pattern caused by illuminance unevenness may be formed on the wall surface. Therefore, it is preferable that the illuminance unevenness is reduced to the level of the trial product examples A and B.

Figure 15:
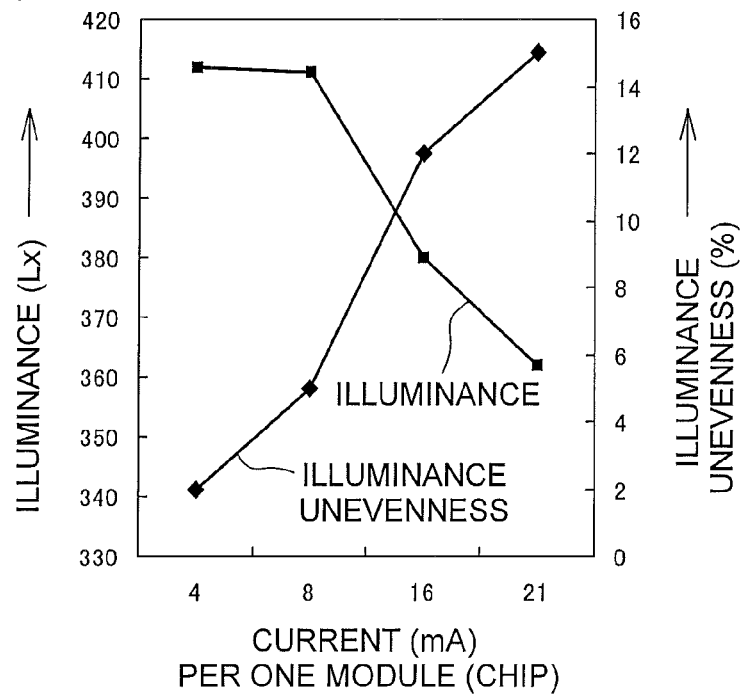
FIG. 15 is a diagram showing a relationship among a current per one LED module, illuminance, and illuminance unevenness.

FIG. 15 is a graph showing the relationship among a drive current of each LED module 3, an illuminance at 1 m, and illuminance unevenness based on Table 1 shown above. FIG. 15 indicates that a necessary illuminance can be secured and the illuminance unevenness can be reduced to an acceptable range by setting a drive current per one LED module 3, that is, per one LED chip 31 to not more than 8 mA.

On the other hand, in the trial product example A, the mounting density of the LED modules 3 is approximately 31/cm$^2$, or the occupied area ratio is approximately 39%. In the trial product example B, the mounting density of the LED modules 3 is approximately 15/cm$^2$, or the occupied area ratio is approximately 20%. Further, in the trial product example C, the mounting density of the LED modules 3 is approximately 8/cm$^2$, or the occupied area ratio is approximately 10%. In the trial product example D, the mounting density of the LED modules 3 is approximately 6/cm$^2$, or the occupied area ratio is approximately 8%. Although the mounting density and the occupied area ratio within the ranges of the trial product examples A and B are preferable, even in the case of the trial product examples C and D, the planar light source portion 3A can look like a light emitting surface which emits uniform light. For obtaining such uniform surface luminescence, it is preferable that the mounting density is set to not less than 5/cm$^2$ (preferably not less than 12/cm$^2$, more preferably not less than 25/cm$^2$) or the occupied area ratio is set to not less than 6% (preferably not less than 15%, more preferably not less than 30%).

The mounting density in the trial product example A is obtained based on the calculation formula "603/(2.5 cm×2.5 cm×3.14)." The occupied area ratio in the trial product example A is obtained based on the calculation formula "(603×1.6 mm×0.8 mm)/(2.5 cm×2.5 cm×3.14)." In other trial product examples, the above-described values are also obtained based on corresponding calculation formulas.

In the lighting device A1, by providing the oblique joint portions 25, the plurality of LED modules 3 arrayed systematically in the x direction can be connected so as to belong to a plurality of groups connected in series to each other. The systematic array of the plurality of LED modules 3 is important for obtaining uniform surface luminescence. Connection of the plurality of LED modules 3 so as to belong to the plurality of groups connected in series to each other is advantageous for setting the current If to be supplied to each LED module 3 to a low current suitable for high-efficiency luminescence and setting the voltage between the anode electrode 21A and the cathode electrode 21B to approximately 27V that realizes comparatively easy constant current control.

As shown in FIG. 3, the straight joint portion 26 is a boundary where the disposition in the x direction of the plurality of anode folding portions 24A and the plurality of cathode folding portions 24B is reversed. Accordingly, on the side on which the anode electrode 21A and the cathode electrode 21B are disposed, the anode folding portions 24A and the cathode folding portions 24B are disposed so as to face the anode electrode 21A and the cathode electrode 21B. Therefore, the anode connecting portion 27A and the cathode connecting portion 27B extending from the anode electrode 21A and the cathode electrode 21B can be shortened.

Figure 16A:
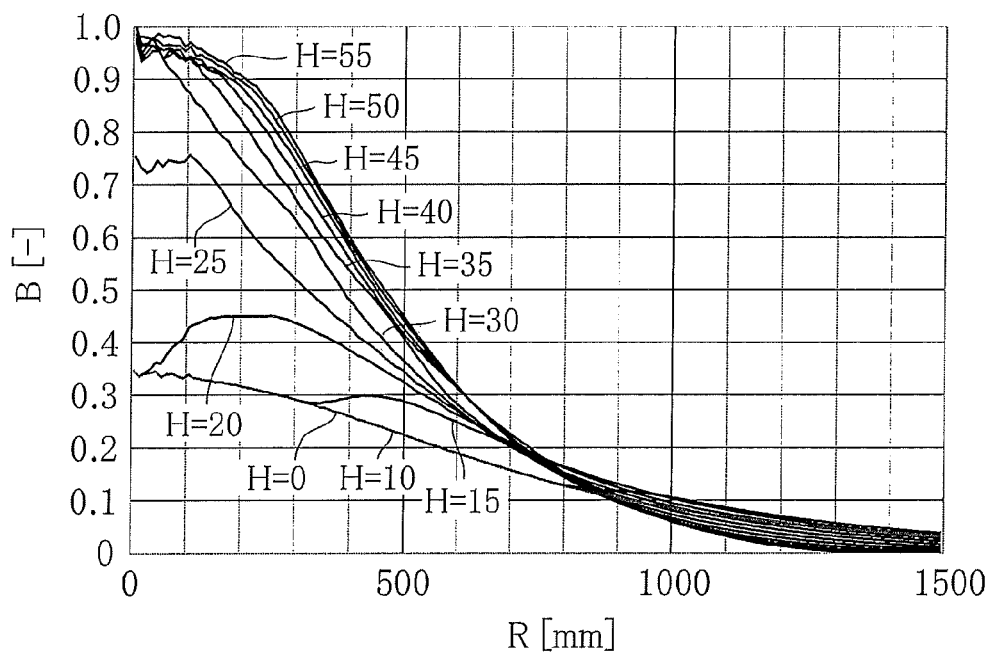
FIG. 16A is a graph showing changes in distribution of relative illuminance B according to the distance H.

By setting the diameters D1 and D2 and the distance H to the dimensions described above, the illuminance in the irradiation range of the lighting device A1 can be distributed suitably as a downlight. FIG. 16A shows illuminance distributions when the distance H is changed in the case where the diameter D1=60 mm and the diameter D2=100 mm. In detail, illuminance distributions when H=55 mm, 50 mm, 45 mm, 40 mm, 35 mm, 30 mm, 25 mm, 20 mm, 15 mm, 10 mm, and 0 mm are shown by curves, respectively. The horizontal axis indicates a radius R centered at the front face of the lighting device A1 on an irradiation surface at a distance of 1 m from the lighting device A1, and the vertical axis indicates a relative illuminance B on the irradiation surface. The relative illuminance B indicates a relative illuminance when the illuminance in the case of H=55 mm and R=0 mm is defined as 1.

As is understood from this drawing, when H=55 mm (H/D2=0.55) to 30 mm (H/D2=0.3), the relative illuminance B at R=0 mm is almost 1.0, and as R increases, the relative illuminance B gently decreases. On the other hand, when H=25 mm to 0 mm, the relative illuminance B at R=0 mm decreases significantly. This means that, if H is not more than 25 mm, light leaks to an improperly wide range. Therefore, H≥30 mm is preferable for clearly irradiating the irradiation range. In order to obtain such clear irradiation, the reflector 4 is preferably configured so as to satisfy 0.5≤D1/D2≤0.69 and 0.3≤H/D2≤0.55.

Figure 16B:
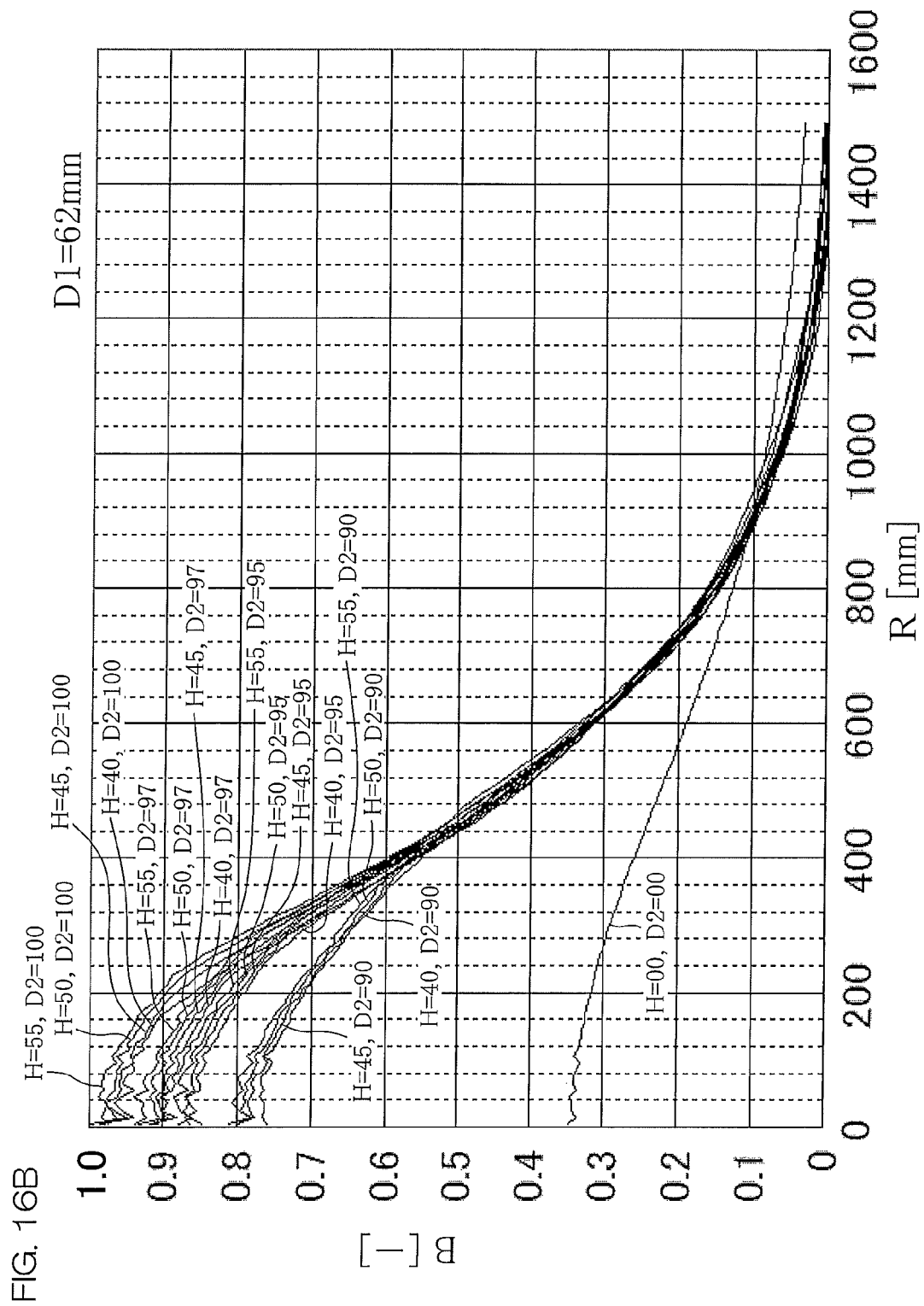
FIG. 16B is a graph showing changes in distribution of relative illuminance B according to the diameter D2 and distance H.
Figure 17:
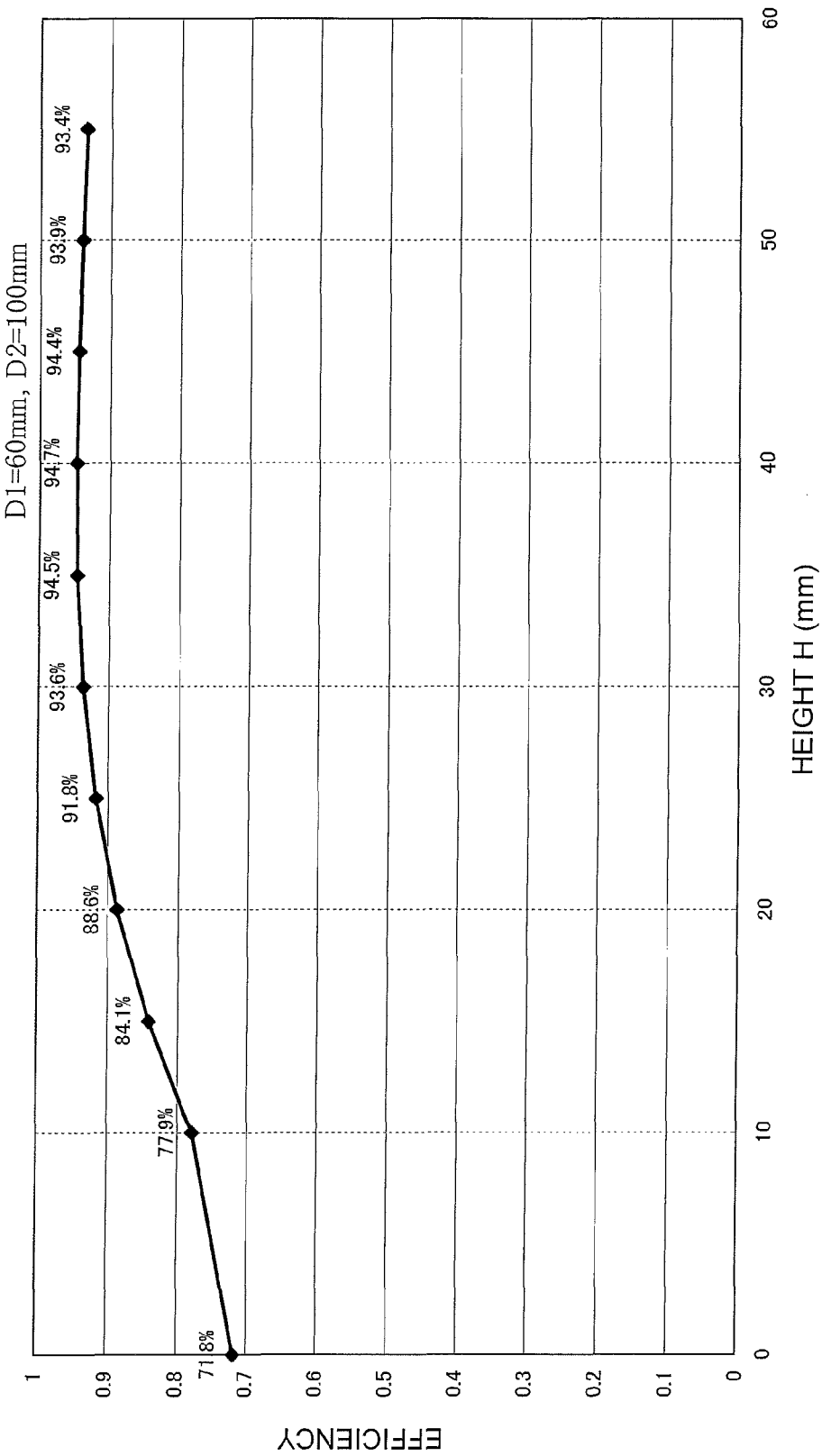
FIG. 17 is a diagram showing changes in efficiency according to the distance H.

FIG. 16B shows illuminance distributions when the diameter D1=D2 mm and the diameter D2 and distance H are changed to various values. The horizontal axis indicates the radius R centered at the front face of the lighting device A1 on an illumination surface at a distance of 1 m from the lighting device A1, and the vertical axis indicates the relative illuminance B on the illumination surface. The relative illuminance B is a relative illuminance when the illuminance under conditions of H=45 mm, D2=100, and R=0 mm is defined as 1. FIG. 16B shows the relative illuminances B when the distance H and the diameter D2 are set to the following combinations.
H=55 mm, D2=100 mm
H=50 mm, D2=100 mm
H=45 mm, D2=100 mm
H=40 mm, D2=100 mm
H=55 mm, D2=97 mm
H=50 mm, D2=97 mm
H=45 mm, D2=97 mm
H=40 mm, D2=97 mm
H=55 mm, D2=95 mm
H=50 mm, D2=95 mm
H=45 mm, D2=95 mm
H=40 mm, D2=95 mm
H=55 mm, D2=90 mm
H=50 mm, D2=90 mm
H=45 mm, D2=90 mm
H=40 mm, D2=90 mm
H=0 mm, D2=0 mm FIG. 17 shows results of investigation on the efficiency when the distance H was set to various values in the case where D1=60 mm and D2=100 mm (D1/D2=0.6). Here, "efficiency" means a ratio of light amount that enters a 3 m-square light receiving surface centered at a position at a distance of 1 m from the exit-side opening 42 of the reflector 4 in the normal direction of the substrate 1 to the total outgoing light amount. High efficiency is realized in the range of H≥30 mm, and the efficiency does not greatly change in the range of H≥40 even if the distance H is increased. Therefore, from the point of view of height reduction, H=30 mm to 40 mm is preferable.

FIG. 18A to FIG. 18D are graphs showing results of measurement of the emission illuminance in the reflector 4 the dimensions of which are determined as shown in the following No. 1 to No. 9. No. 10 is a relative illuminance when no reflector is provided. "Emission illuminance" is a value on a 3 m-square light receiving surface centered at a position at a distance of 1 m from the exit-side opening 42 of the reflector 4 in the normal direction of the substrate 1. "Position" on the horizontal axes of the graphs indicates a distance from the center position of the square light receiving surface as described above.
No. 1 D1=52 mm D2=90 mm H=35 mm (D1/D2=0.58, H/D2=0.39)
No. 2 D1=52 mm D2=90 mm H=40 mm (D1/D2=0.58, H/D2=0.44)
No. 3 D1=52 mm D2=90 mm H=45 mm (D1/D2=0.58, H/D2=0.50)
No. 4 D1=47 mm D2=90 mm H=35 mm (D1/D2=0.52, H/D2=0.39)
No. 5 D1=47 mm D2=90 mm H=40 mm (D1/D2=0.52, H/D2=0.44)
No. 6 D1=47 mm D2=90 mm H=45 mm (D1/D2=0.52, H/D2=0.50)
No. 7 D1=42 mm D2=90 mm H=35 mm (D1/D2=0.47, H/D2=0.39)
No. 8 D1=42 mm D2=90 mm H=40 mm (D1/D2=0.47, H/D2=0.44)
No. 9 D1=42 mm D2=90 mm H=45 mm (D1/D2=0.47, H/D2=0.50)
No. 11 D1=62 mm D2=100 mm H=55 mm (D1/D2=0.62, H/D2=0.55)
No. 12 D1=62 m D2=100 mm H=40 mm (D1/D2=0.62, H/D2=0.40)
No. 13 D1=62 mm D2=90 mm H=40 mm (D1/D2=0.69, H/D2=0.44)
No. 14 D1=52 mm D2=90 mm H=40 mm (D1/D2=0.58, H/D2=0.44)

Figure 18A:
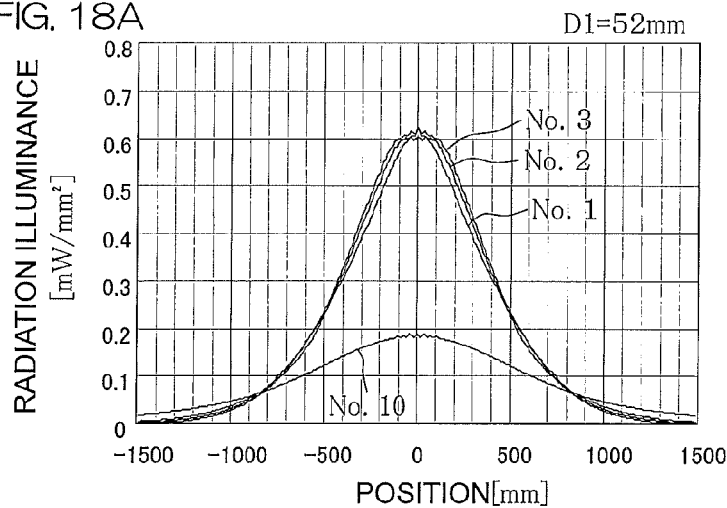
FIG. 18A is a diagram showing relative illuminance distributions when using reflectors of various sizes.

When the diameter of the ceiling hole is set to 100 mm, the diameter D2 of the exit-side opening 42 can be set to approximately 90 mm. In this case, when D1=52 mm is set, as shown in FIG. 18A, in the case where the distance H from the exit-side opening surface to the substrate 1 is changed to H=35 mm, H=40 mm, and H=45 mm, the emission illuminance becomes values with waveforms shown in No. 1, No. 2, and No. 3in these cases, and these are substantially equal to each other.

Figure 18B:
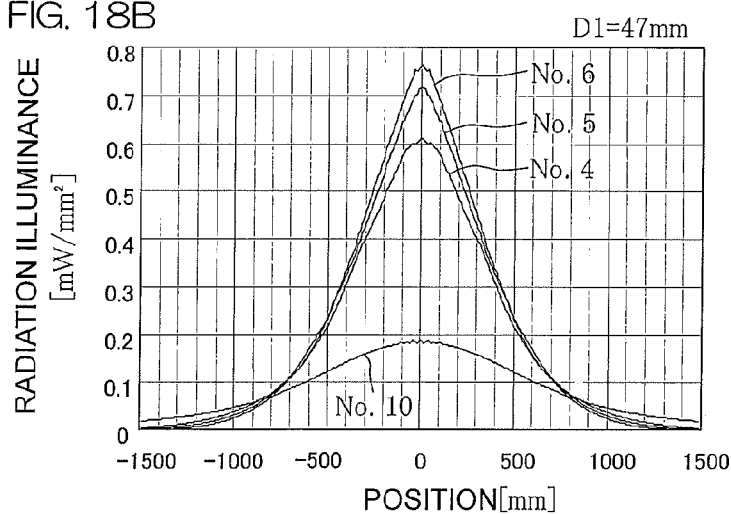
FIG. 18B is a diagram showing relative illuminance distributions when using reflectors of various sizes.

On the other hand, when D2=90 mm and D1=47 mm, as shown in FIG. 18B, in the case where the distance H is changed to H=35 mm, H=40 mm, and H=45 mm, the emission illuminance becomes values with waveforms shown in No. 4, No. 5, and No. 6 in these cases, and variation occurs in emission illuminance.

Figure 18C:
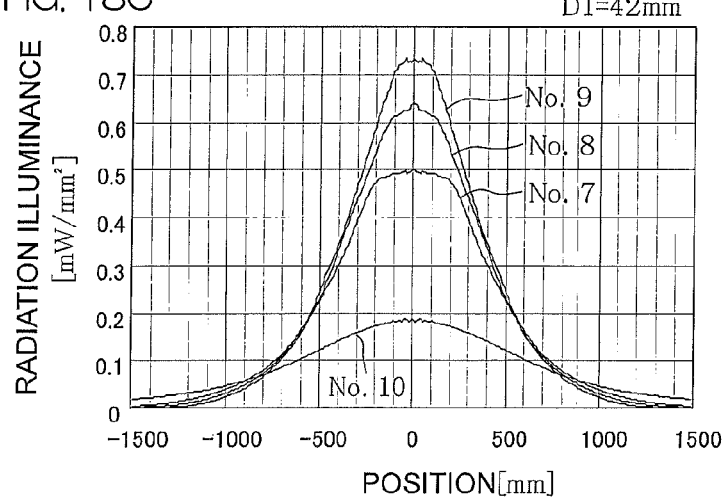
FIG. 18C is a diagram showing relative illuminance distributions when using reflectors of various sizes.

Further, as shown in FIG. 18C, when D1=42 mm, in the case where the distance H is changed to H=35 mm, H=40 mm, and H=45 mm, greater variation occurs in emission illuminance as composed to the case of D1=47 mm.

Based on the above-described measurement results, when the reflector 4 with a large D2=90 mm and D1=not more than 45 mm is used, emission illuminance due to the height greatly varies when the height H is changed according to design changes. Therefore, when setting D2=90 mm, in order to prevent the emission illuminance from being varied by design changes, D1 is preferably not less than 45 mm. Also, in the light of the mounting density of the LED modules, D1 is preferably not less than 45 mm According to this, the range of D1/D2=not less than 0.5 is preferable.

As shown in FIG. 18D, when the reflector 4 with D2=90 mm and H=40 mm is used, in the case where D1=52 mm, emission illuminance with the waveform shown in No. 14 can be obtained.

On the other hand, when D1=62 mm is set while D2=90 mm and H=40 mm, like the emission illuminance with the waveform shown in No. 13, the condensation effect becomes smaller and the emission illuminance immediately under the equipment becomes smaller as compared with the emission illuminance shown by the waveform of No. 14.

For the above-described reasons, when H=40 mm and the diameter D2 of the exit-side opening is increased to D2=90 mm, it is preferable that D1=not more than 62 mm, that is, D1/D2=not more than 0.69 (more preferably, not more than 0.67).

It was found by the inventors' research that the reduction in the current If to be supplied to each LED module 3 is advantageous for reducing variation in the voltage Vf for setting the current If to a desired value. The inventors measured the voltage Vf when the current If for the plurality of LED modules 3 was regulated to 10, 100, 200, and 300 mA, and evaluated the variation in the voltage. As a result, the variation coefficients obtained by dividing the standard deviations of the measured voltages Vf by an average were 0.79, 4.6, 6.1, and 5.4 when the current If was 10, 100, 200, and 300 mA in order. The larger the variation coefficient, the larger the variation in the voltage Vf in each measurement. In this measurement, when the current If is 10 mA, the variation is much smaller than other cases. In the present preferred embodiment, the current If flowing in the LED module 3 is 4.0 mA that is smaller than 10 mA, so that it can be assumed that the variation in the voltage Vf is very small.

For example, when electric power of 7 W was supplied to 6 LED chips the number of which does not form a planar light source 3A unlike the present preferred embodiment, the temperature of the substrate 1 was 50° C. to 60° C., and on the other hand, the temperature of the substrate 1 in the present preferred embodiment was 40° C. to 45° C. A possible reason for this is that although the supplied electric power is the same, heat radiation to the housing 5 is greater in the present preferred embodiment in which the LED modules 3 (LED chips 31) as heat generation sources are mounted in a more dispersed manner. Thus, with the configuration including the planar light source portion 3A, heat radiation during illumination can be comparatively advantageously performed.

By forming the inner surface of the reflector 4 as an uneven metal surface, light from the lighting device A1 can be made more uniform.

FIG. 19 to FIG. 27 show another example of a lighting device and components thereof according to the present invention. In these drawings, elements identical or similar to those in the preferred embodiment described above are provided with the same reference symbols as in the preferred embodiment described above, and description thereof shall be omitted.

Figure 19:
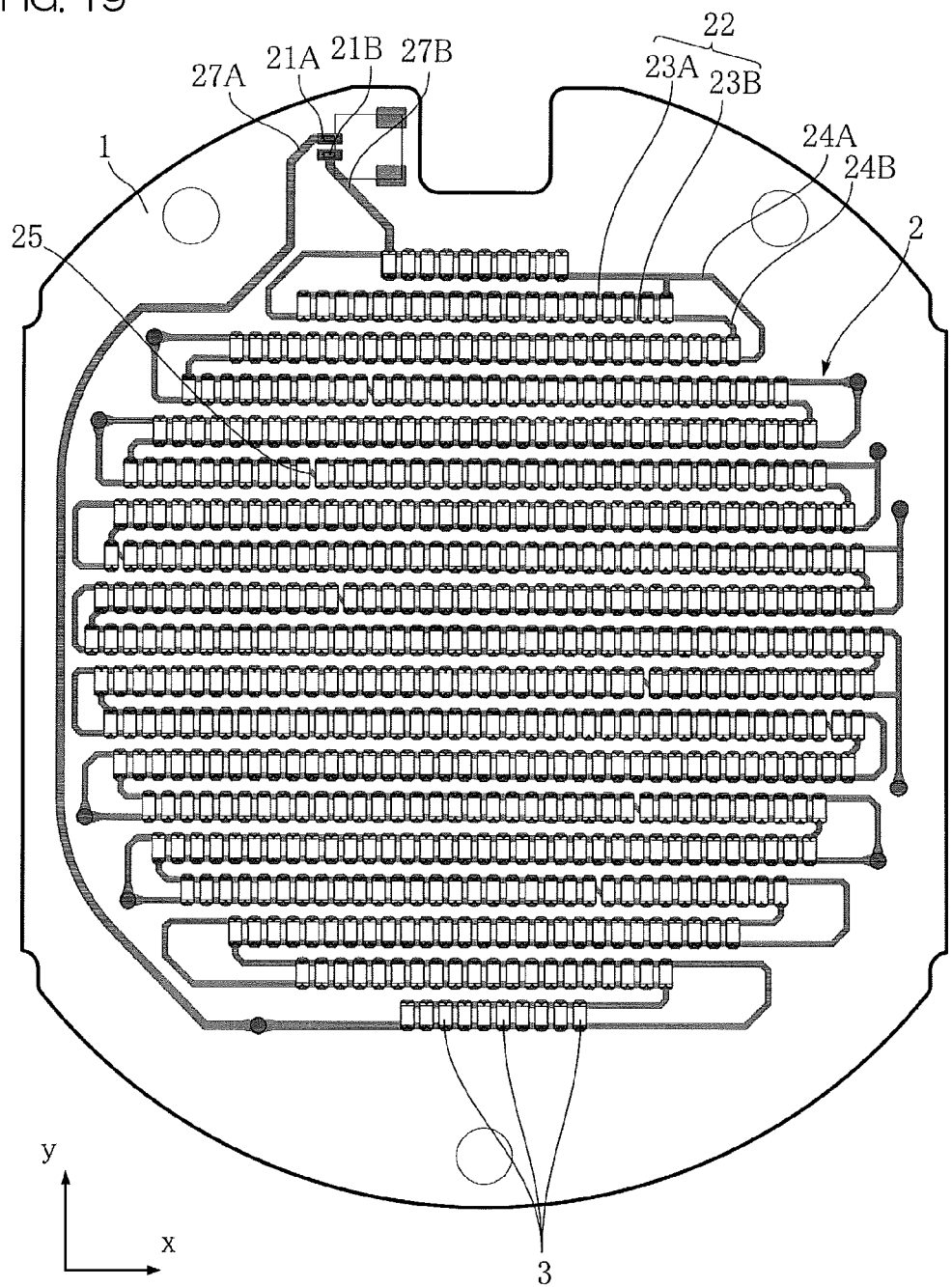
FIG. 19 is a plan view showing another example of a substrate and a wiring pattern to be used in the lighting device shown in FIG. 1.

FIG. 19 shows another example of a substrate 1, a wiring pattern 2, and a plurality of LED modules 3. In the configuration shown in this drawing, the substrate 1 is substantially oval. The shape of the wiring pattern 2 is different from that of the preferred embodiment described above. The mounting density of the plurality of LED modules 3 is the same as in the preferred embodiment described above. With this configuration, the number of substrates 1 which can be formed from a material of the substrate 1 can be increased, and this is preferable for reduction in manufacturing cost.

Figure 20:
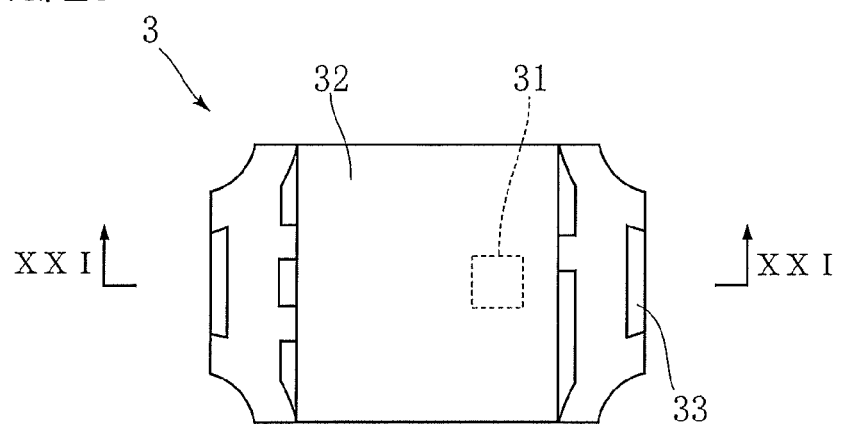
FIG. 20 is a plan view showing another example of an LED module to be used in the lighting device shown in FIG. 1.
Figure 21:
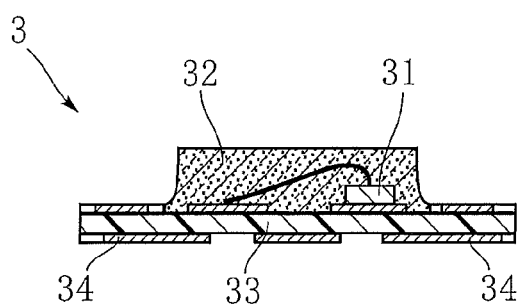
FIG. 21 is a sectional view taken along line XXI-XXI of FIG. 20.
Figure 22:
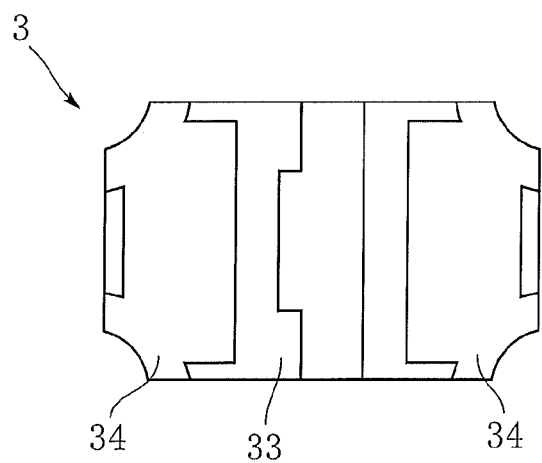
FIG. 22 is a bottom view showing another example of an LED module to be used in the lighting device shown in FIG. 1.

FIG. 20 to FIG. 22 show another example of the LED module 3. The LED module 3 shown in these drawings has a width of 0.6 mm, a length of 1.0 mm, and a thickness of 0.2 mm, and is configured as a small-sized and very thin LED module. By using this LED module 3 and setting the interval between adjacent LED modules 3 to approximately 0.5 mm, the mounting density of the LED modules 3 can be increased to at least 60/cm². This configuration is suitable for making the planar light source portion 3A look like a light emitting surface which emits more uniform light. This LED module 3 is equivalent to type B of the graph shown in FIG. 11. This type of LED module 3 can be expected to increase luminous efficiency as the current IF becomes smaller. When the power consumption is the same as the lighting device A1, the current If can be made smaller by increasing the mounting density.

Figure 23:
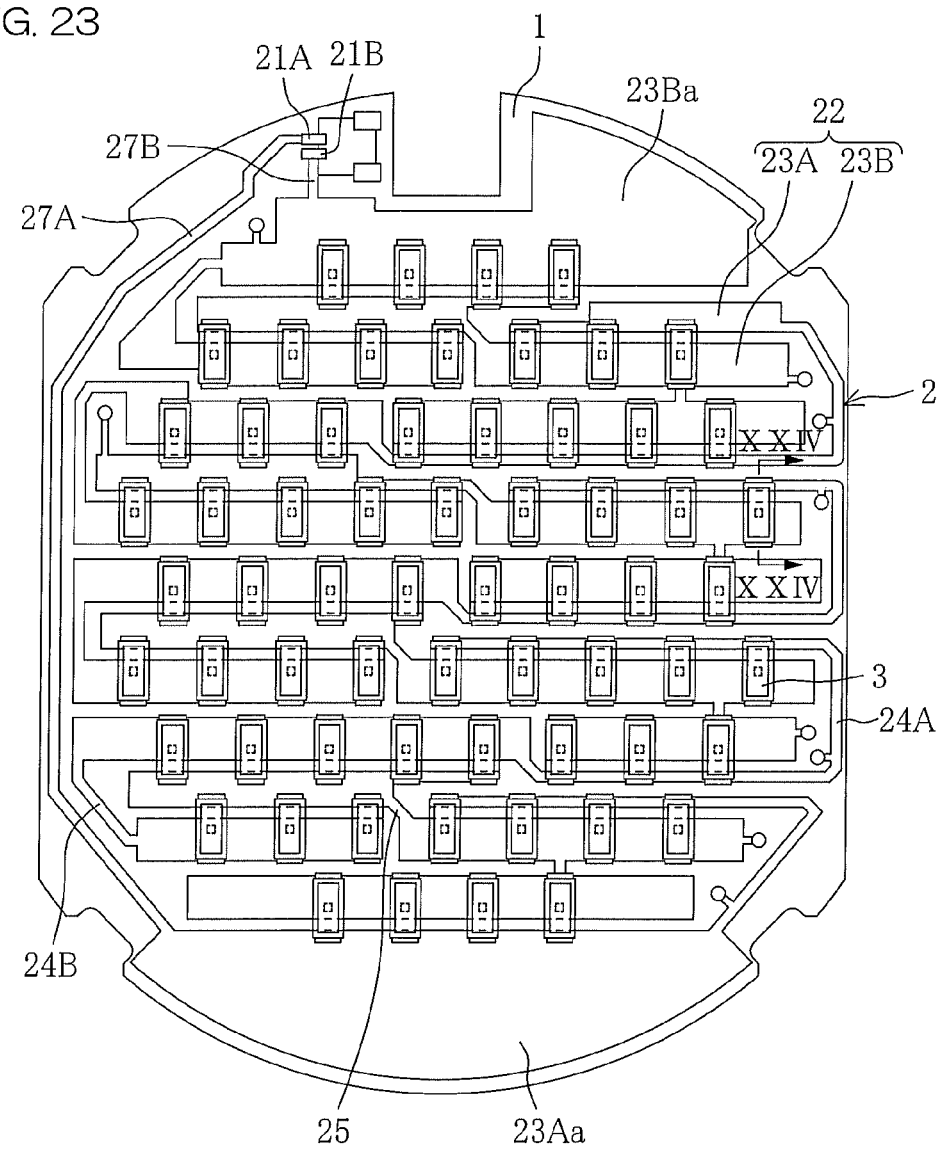
FIG. 23 is a plan view showing another example of a substrate and a wiring pattern to be used in the lighting device shown in FIG. 1.
Figure 24:
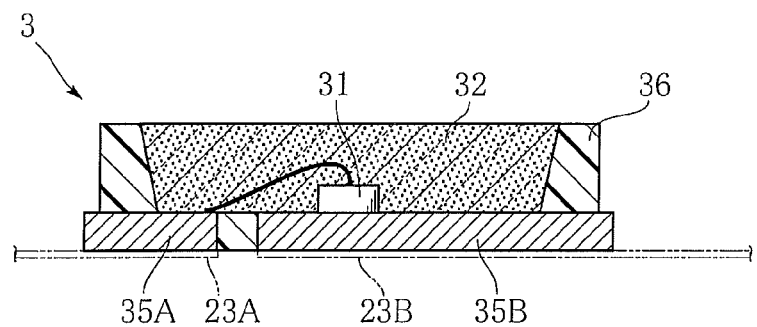
FIG. 24 is a major portion sectional view taken along line XXIV-XXIV of FIG. 23.

FIG. 23 and FIG. 24 show another example of a substrate 1, a wiring pattern 2, and a plurality of LED modules 3. In the configuration shown in these drawings, the dimensions of the substrate 1 are the same as in the examples described above; however, the configurations of the wiring pattern 2 and the LED modules 3 are different from those in the preferred embodiments described above.

As shown in FIG. 24, this LED module 3 includes leads 35A and 35B and a reflector 36. The leads 35A and 35B are plate-shaped members made of, for example, Cu—Ni alloy. On the lead 35B, an LED chip 31 is mounted, and the lead 35A is electrically conductive to the LED chip 31 via a wire. The reflector 36 is made of, for example, white resin. The lower surfaces of the leads 35A and 35B are exposed from the reflector 36, and are used as mounting terminals for surface-mounting the LED module 3. The LED module 3 has a size of 4.0 mm×2.0 mm.

As shown in FIG. 23 and FIG. 24, in the present preferred embodiment, the cathode linear portion 23B is comparatively wide. In detail, as clearly shown in FIG. 23 in a plan view, the cathode linear portion is so wide that the LED chip 31 and the cathode linear portion 23B overlap each other. Further, the cathode linear portion 23B faces the entire back surface of the lead 35B. In the configuration using an LED module 3 including an LED chip 31 installed so that its polarity is opposite to that of the LED chip 31 of the present preferred embodiment, instead of the cathode linear portion 23B, the anode linear portion 23A may be widened so as to overlap such LED chips 31.

The wiring pattern 2 includes an anode widened portion 23Aa and a cathode widened portion 23Ba. The anode widened portion 23Aa is electrically conductive to the anode linear portions 23A, and the cathode widened portion 23Ba is electrically conductive to the cathode linear portions 23B. The anode widened portion 23Aa and the cathode widened portion 23Ba are disposed close to end portions of the substrate 1, and their outer edges are shaped along the outer edge of the substrate 1.

In the present preferred embodiment, the mounting density is approximately 3.0/cm², and the occupied area ratio is approximately 24%. Even in this preferred embodiment, a planar light source portion 3A which can be made to look like surface luminescence as compared with a configuration in which, for example, 6 LED modules 3 are mounted, can be formed. Further, by setting the interval between the LED modules 3 to approximately 0.5 mm, the occupied area ratio can be increased to approximately 70%. This configuration is preferable for making the planar light source portion 3A look like a light emitting surface that emits very uniform light.

Heat from the LED chip 31 is preferably transmitted to the cathode linear portion 23 via the lead 35B. The cathode linear portion 23B itself is wide, so that the heat from the LED chip 31 can be quickly diffused. Further, by the anode widened portion 23Aa and the cathode widened portion 23Ba, radiation of heat transmitted from the anode linear portion 23A and the cathode linear portion 23B to the outside can be enhanced. With this configuration, in the present preferred embodiment, heat from the LED module 3 can be efficiently radiated.

Figure 25:
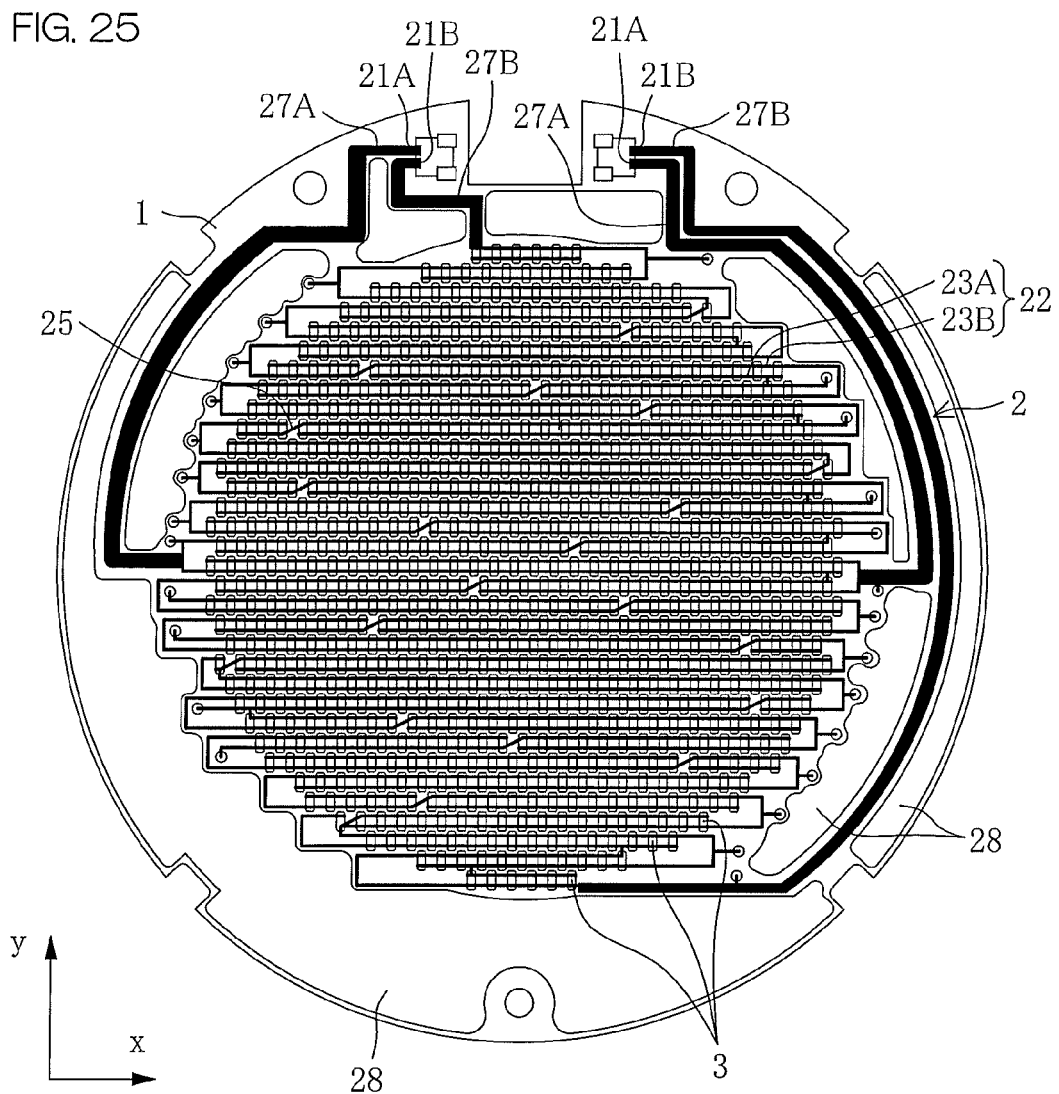
FIG. 25 is a plan view showing still another example of a substrate and a wiring pattern to be used in the lighting device shown in FIG. 1.

FIG. 25 shows still another example of a substrate 1, a wiring pattern 2, and a plurality of LED modules 3. The substrate 1 shown in this drawing has a contour of approximately 102 mm, and is used for a lighting device A1 having a size suitable for installation in an opening with a diameter of approximately 150 mm opened in a ceiling or the like. On this substrate 1, approximately 816 LED modules 3 of the type shown in FIG. 6 to FIG. 8 are mounted. The diameter D1 of the opening 41 of the reflector 4 is set to approximately 70 mm.

The wiring pattern 2 includes a plurality of nonconductive radiation portions 28. The nonconductive radiation portions 28 are not electrically conductive to any of the anode linear portions 23A and the cathode linear portions 23B, and are disposed close to the end portion of the substrate 1 with respect to the anode linear portions 23A and the cathode linear portions 23B. Each nonconductive radiation portion 28 has an outer edge along the outer edge of the substrate 1.

With this configuration, the planar light source portion 3A can also be made to look like a light emitting surface. By providing the nonconductive radiation portions 28, a part of the substrate 1 can be prevented from becoming improperly high in temperature.

Of course, as in the example described above, it is also possible that the LED modules 3 shown in FIG. 25 are thinned out to reduce the number of LED modules 3 to ½ of that in the configuration of FIG. 25. Accordingly, a necessary illuminance can be secured and excellent luminous efficiency can be realized by a smaller number of LED modules 3.

Figure 26:
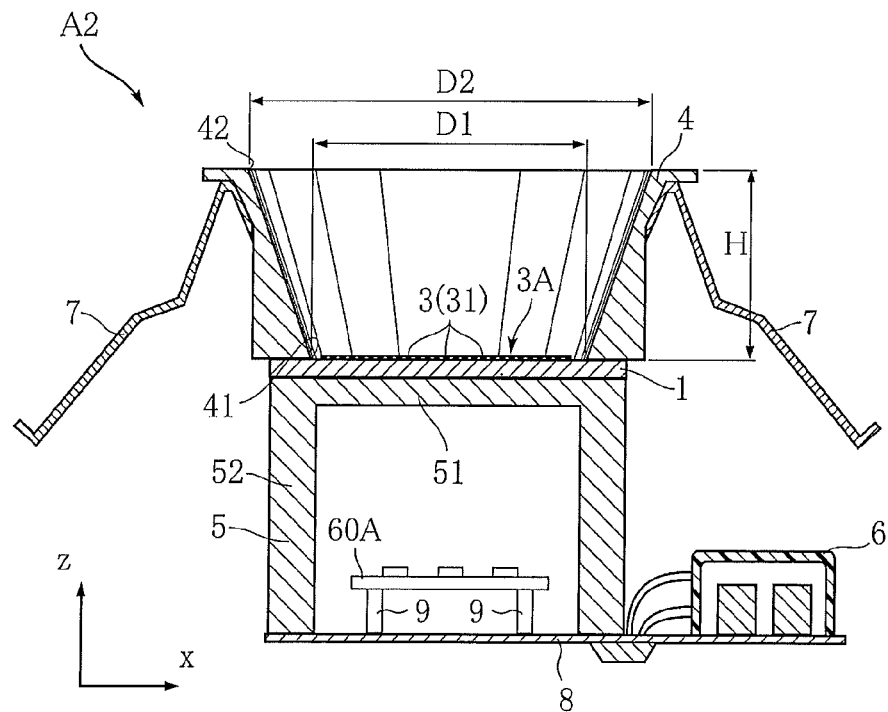
FIG. 26 is a sectional view showing a lighting device according to a second preferred embodiment of the present invention.

FIG. 26 shows a lighting device according to a second preferred embodiment of the present invention. The lighting device A2 of the present preferred embodiment includes the housing 5 the configuration of which is different from that in the preferred embodiment described above. The housing 5 of the present preferred embodiment has a bottom portion 51 and a cylindrical portion 52, and structured so that these portions are linked integrally. The substrate 1 is in contact with the bottom portion 51.

With this configuration, heat can be quickly transmitted from the substrate 1 to the bottom portion 51. Then, this heat can be diffused from the bottom portion 51 to the cylindrical portion 52. Accordingly, heat radiation performance of the plurality of LED modules 3 can be further enhanced.

Figure 27:
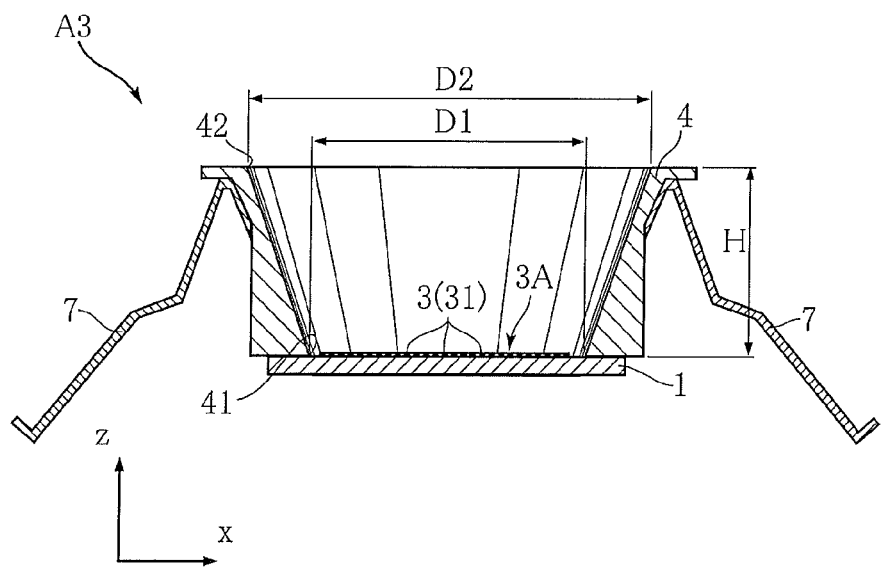
FIG. 27 is a sectional view showing a lighting device according to a third preferred embodiment of the present invention.

FIG. 27 shows a lighting device according to a third preferred embodiment of the present invention. The lighting device A3 in the present preferred embodiment is a power source separate type in which a power supply unit is disposed separately of the lighting device main body. Therefore, the housing 5 of the preferred embodiment described above is not provided. Accordingly, the lighting device main body can be reduced in height, so that it can be installed into a mounting space even if the mounting space is limited.

Other detailed configurations of the respective portions of the lighting device can be variously changed in design.

For example, in addition to the configuration in which all LED modules 3 emit light with the same wavelength, a configuration in which a plurality of LED modules 3 that emit light with wavelengths different from each other is also possible. For example, a configuration including LED modules 3 that emit incandescent light and LED modules 3 that emit daylight color is also possible. In this case, by controlling proportions of the LED modules to be made to actually emit light among the incandescent-light LED modules 3 and the daylight-color LED modules 3, or by individually controlling the currents If of the LED modules 3, incandescent light, warm white, white, neutral white, and daylight color can be arbitrarily irradiated. Further, for example, green LED modules 3 may be disposed so as to surround white LED modules 3. A usage may such that white LED modules 3 are made to emit light normally, and in case of emergency, green LED modules 3 are made to emit light. The LED modules 3 are not limited to an LED module that includes one LED chip 31, and may include three LED chips 31 which emit red light, green light, and blue light, for example.

Without changing the configurations of the substrate 1 and the wiring pattern 2, by reducing the number of LED modules 3, the rated powers of the lighting device A1 to A3 can be easily changed. For example, when LED modules 3 are omitted at a rate of one of every three from the plurality of LED modules 3 of the lighting device A1, the rated power can be reduced to ⅔. Alternatively, when LED modules 3 are omitted at a rate of two of every three from the plurality of LED modules 3 of the lighting device A1 to A3, the rated power can be reduced to ⅓.

It is also possible that a lens is provided on the exit-side opening 41 side of the reflector 4 to condense or diffuse light generated from the LED modules 3.

By properly setting the color of the substrate 1 and the color of the resist covering the wiring pattern 2, a configuration in which an arbitrary pattern or character appears when the LED modules 3 are turned off can be realized.

The shape of the substrate 1 is not limited to a circle, but may be various shapes such as a rectangle typified by a square, a polygon such as a hexagon, etc.

The use of the lighting device is not limited to a downlight, and can be used for various purposes in which light irradiation from a planar light source portion is preferable.

Figure 28:
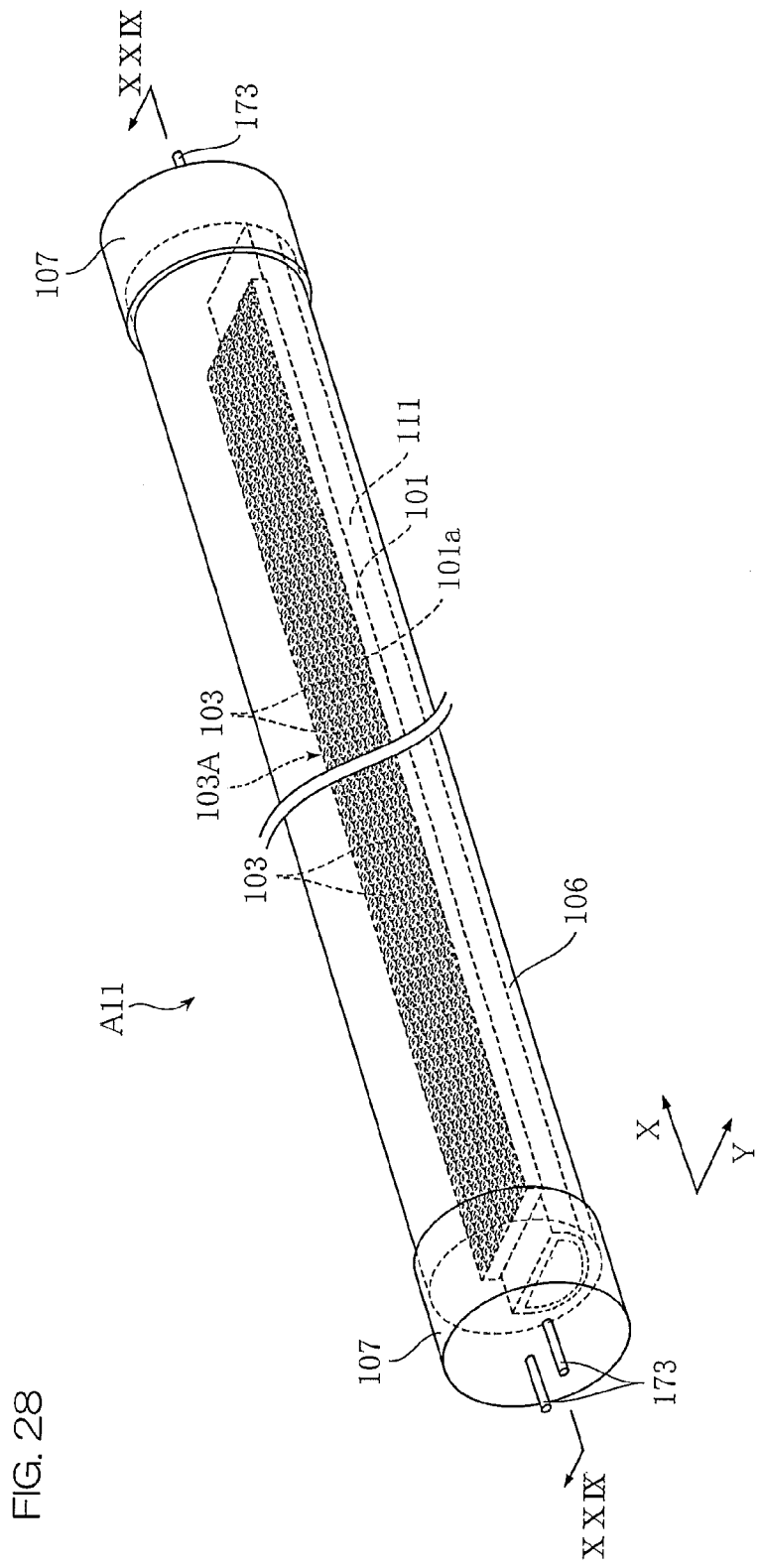
FIG. 28 is a perspective view showing an example of an LED lamp according to a fourth preferred embodiment of the present invention.
Figure 29:
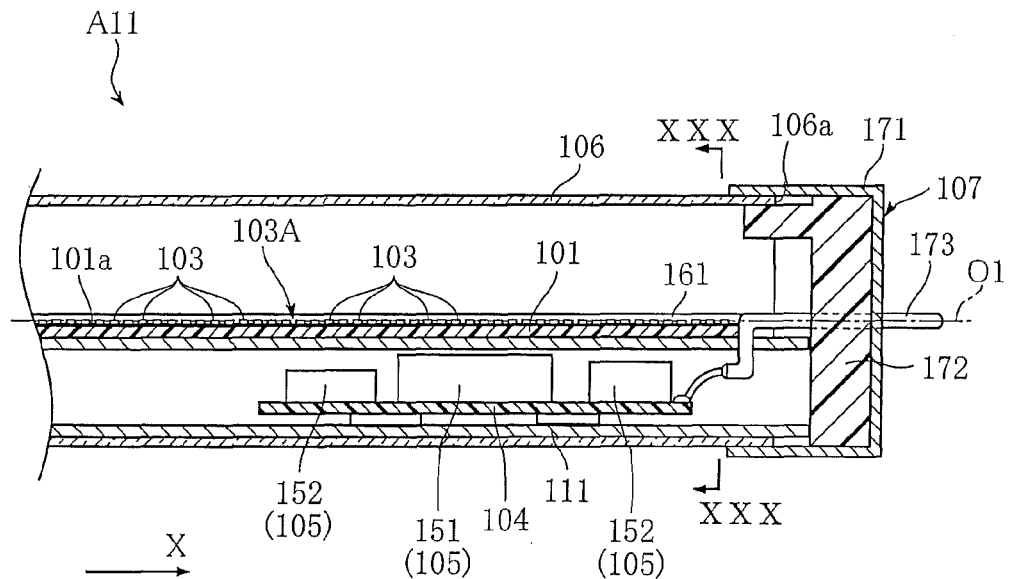
FIG. 29 is a major portion sectional view taken along line XXIX-XXIX of FIG. 28.
Figure 30:
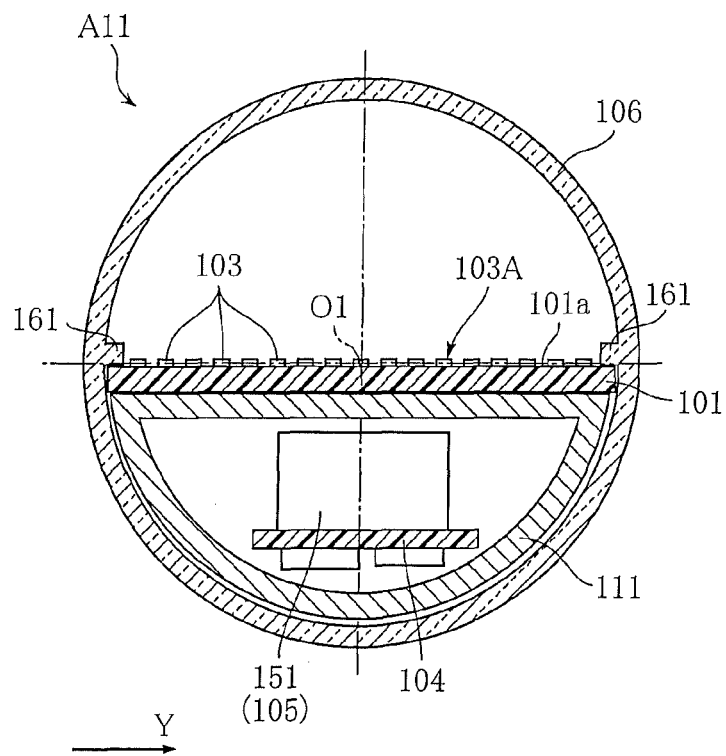
FIG. 30 is a sectional view taken along line XXX-XXX of FIG. 29.

FIG. 28 to FIG. 30 show an LED lamp as a lighting device according to a fourth preferred embodiment of the present invention. The LED lamp A11 of the present preferred embodiment includes a substrate 101, a plurality of LED modules 103, a radiation member 111, a power supply substrate 104, a plurality of power supply components 105, a case 106, and a pair of caps 107, and is used as, for example, a replacement of a straight tube fluorescent lamp by being attached to a general fluorescent lamp lighting fixture.

The substrate 101 is made of, for example, glass epoxy resin, and is formed to have a long rectangular shape. The substrate 101 is stacked on the radiation member 111, and attached to the radiation member 111 by using, for example, screws. As the substrate 101, an aluminum plate the surface of which is insulated may be used.

Figure 31:
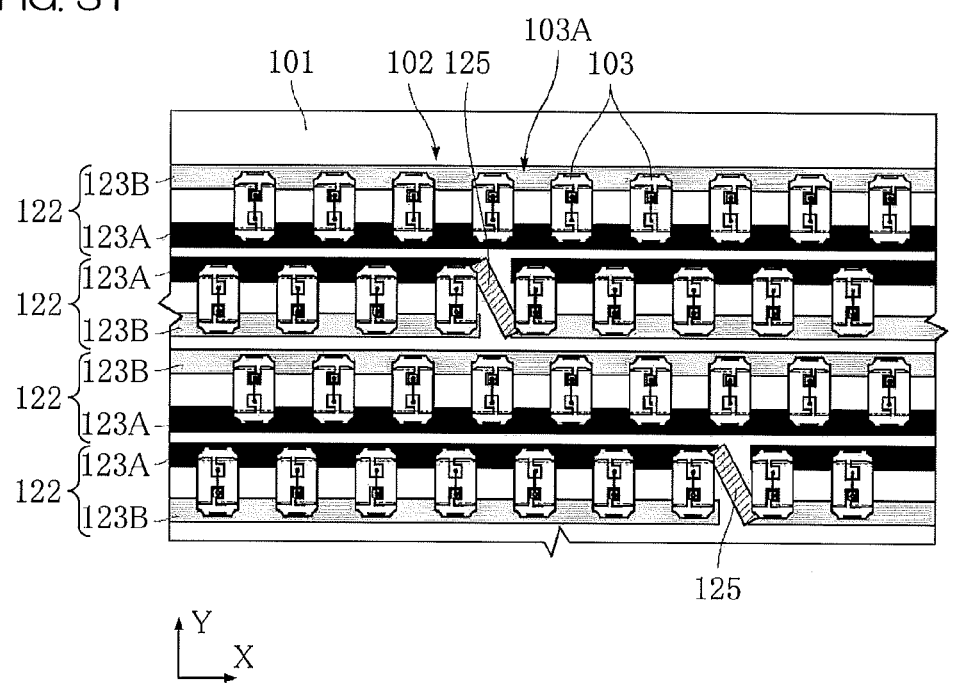
FIG. 31 is a major portion enlarged plan view showing a substrate and LED modules of the LED lamp shown in FIG. 28.
Figure 32:
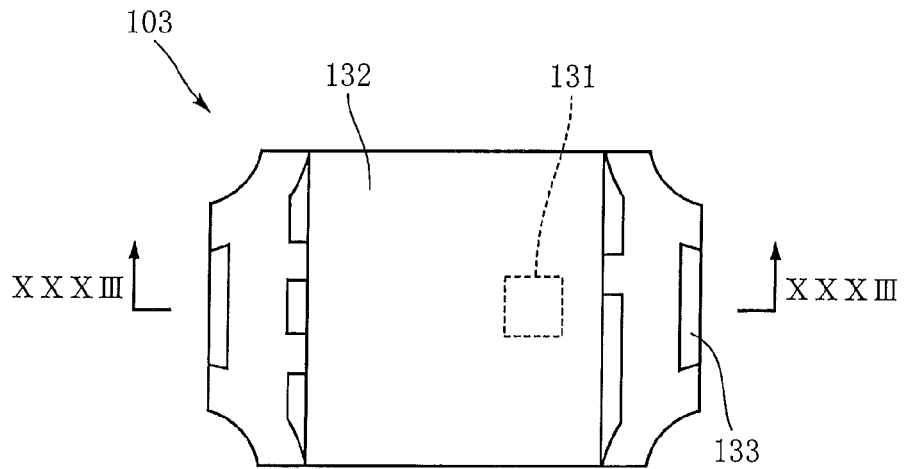
FIG. 32 is a plan view showing an example of an LED module of the LED lamp shown in FIG. 28.
Figure 33:
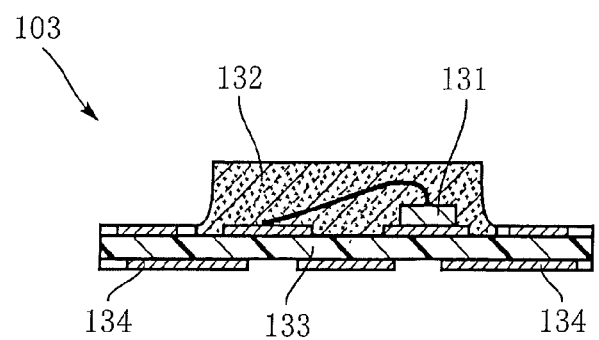
FIG. 33 is a sectional view taken along line XXXIII-XXXIII of FIG. 32.
Figure 34:
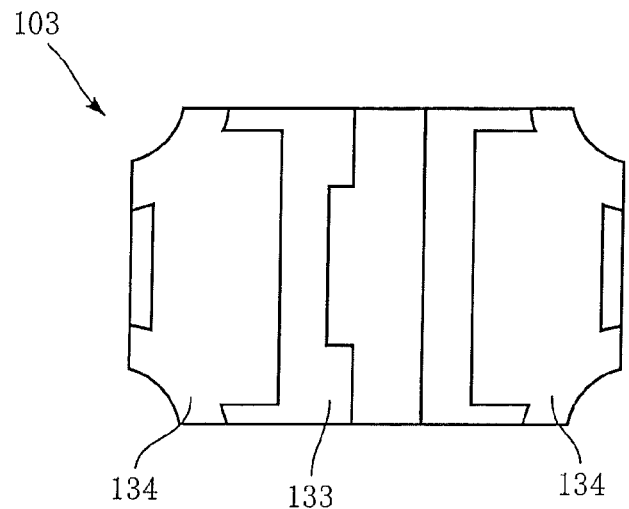
FIG. 34 is a bottom view showing the LED module shown in FIG. 32.

On the upper surface 101*a* of the substrate 101, a plurality of LED modules 103 are mounted. As shown in FIG. 30, in the present preferred embodiment, the plurality of LED modules 103 are arrayed along a plane including the central axis O1 of the case 106. As shown in FIG. 31, the plurality of LED modules 103 are arrayed zigzag. As shown in FIG. 32 to FIG. 34, the LED module 103 includes an LED chip 131, a resin package 132, a substrate 133, and a pair of mounting terminals 134. The LED module 103 has a width of 0.6 mm, a length of 1.0 mm, and a thickness of 0.2 mm, and is configured as a small-sized and very thin LED module.

The substrate 133 is an insulating substrate having a substantially rectangular shape in a plan view and made of, for example, glass epoxy resin. On the surface of the substrate 133, the LED chip 131 is mounted. On the back surface of the substrate 133, a pair of mounting terminals 134 are formed. The thickness of the substrate 133 is set to approximately 0.05 mm to 0.08 mm. The LED chip 131 is a light source of the LED module 103, and can emit, for example, visible light. The resin package 132 is for protecting the LED chip 131. The resin package 132 is molded by using, for example, epoxy resin having translucency for light from the LED chip 131 or a translucent resin containing a fluorescent material which is excited by light from the LED chip 131 to emit light with a different wavelength. In the present preferred embodiment, for example, by mixing blue light from the LED chip 131 and yellow light from the fluorescent material contained in the resin package 132, the LED module 103 can irradiate white. As the fluorescent material, instead of the fluorescent material that emits yellow light, a fluorescent material that emits red light and green light may also be used.

As shown in FIG. 31, on the substrate 101, a wiring pattern 102 is formed. The wiring pattern 102 is formed of a metal film of, for example, copper, and is for mounting a plurality of LED modules 103 and supplying electric power thereto. The wiring pattern 102 includes a plurality of pad portions 122. In the wiring pattern 102, portions other than the portions for mounting the LED modules 103 are covered by an insulating layer (not shown) with high reflectance, for example, white resist.

The plurality of pad portions 122 are portions on which the plurality of LED modules 103 are mounted. The pad portion 122 includes an anode linear portion 123A (black in the drawing) and a cathode linear portion 123B (gray in the drawing). The anode linear portion 123A and the cathode linear portion 123B extend in the longitudinal direction X, and are disposed parallel to each other at an interval in the width direction Y. Accordingly, all of the plurality of pad portions 122 extend along the longitudinal direction X. Most of the plurality of pad portions 122 are disposed parallel to each other at intervals in the width direction Y. Further, several pad portions 122 are disposed in series at intervals in the longitudinal direction X.

The LED module 103 is mounted on the pad portion 122 by soldering one of the pair of mounting terminals 134 to the anode linear portion 123A and soldering the other mounting terminal to the cathode linear portion 12B. Accordingly, a plurality of LED modules 103 mounted on one pad 122 are connected in parallel to each other. Across the oblique joint portion 125, two groups each consisting of a plurality of LED modules 103 connected in parallel are disposed. The two pad portions 122 disposed on both sides of the oblique joint portion 125 have the same disposition of the anode linear portion 123A and the cathode linear portion 123B in the width direction Y. The oblique joint portion 125 joins the anode linear portion 123A of one of the pad portions 122 and the cathode linear portion 123B of the other pad portion 122. Accordingly, the plurality of LED modules 103 belonging to these two groups are connected in series to each other.

Figure 35:
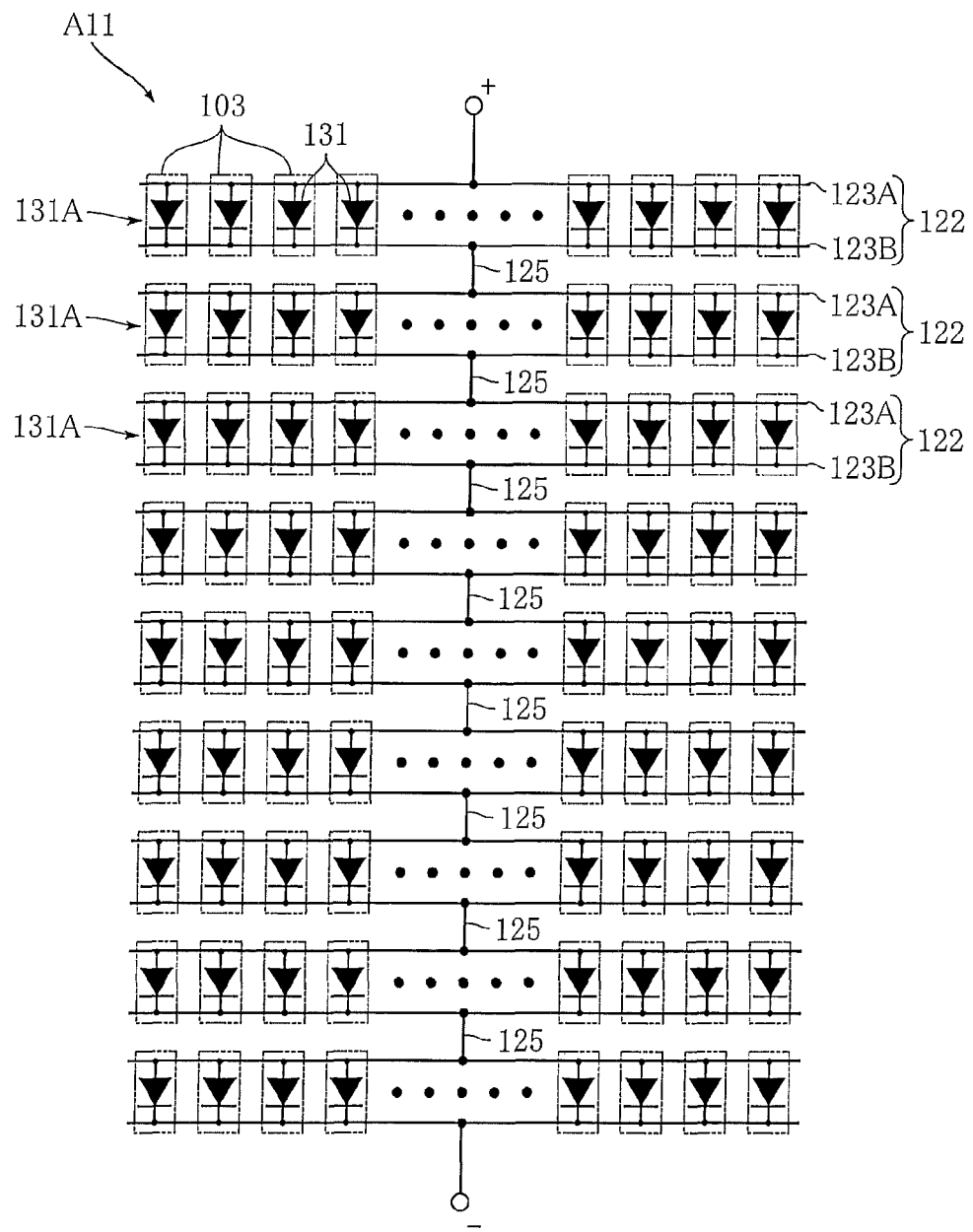
FIG. 35 is a circuit diagram showing the LED lamp shown in FIG. 28.

With this configuration, the plurality of LED modules 103, that is, the plurality of LED chips 131 are connected as shown in FIG. 35. In the present preferred embodiment, the plurality of LED modules 103 are divided into a plurality of groups 131A. The group 131A includes a plurality of LED modules 103 connected in parallel to each other. These groups 131A are connected in series to each other. The series circuit of the plurality of groups 131A is connected to the power supply unit formed on the power supply substrate 104 (see FIG. 29). As this power supply unit, the same constant current power supply unit as shown in FIG. 10 described above can be applied.

Although a so-called rated current of each LED module 103 (LED chip 131) is 20 mA, the actual current If flowing is, for example, not more than 4.0 mA. When the plurality of LED modules 103 mounted at high density emit light, they do not look like a set of a plurality of point light sources to the naked eye, but look like surface luminescence. Specifically, the region in which the plurality of LED modules 103 are mounted forms a planar light source portion 103A.

In detail, when the LED lamp A11 has a size corresponding to a 40 W straight tube fluorescent lamp (substrate size is approximately 1.7 cm×120 cm), the number of LED modules 103 to be mounted is not less than 600. More preferably, the number of LED modules 103 to be mounted is not less than 1000, not less than 4000, not less than 8000, and not less than 12000.

When the LED lamp A11 has a size corresponding to a 20 W straight tube fluorescent lamp (substrate size is approximately 1.7 cm×58 cm), the number of LED modules 103 to be mounted is not less than 290. More preferably, the number of LED modules 103 to be mounted is not less than 480, not less than 1900, not less than 3900, and not less than 5800.

When the LED lamp A11 has a size corresponding to a 15 W straight tube fluorescent lamp (substrate size is approximately 1.7 cm×44 cm), the number of LED modules 103 to be mounted is not less than 200. More preferably, the number of LED modules 103 to be mounted is not less than 330, not less than 1300, not less than 2700, and not less than 4000.

When the LED lamp A11 has a size corresponding to a 10 W straight tube fluorescent lamp (substrate size is approximately 1.7 cm×33 cm), the number of LED modules 103 to be mounted is not less than 150. More preferably, the number of LED modules 103 to be mounted is not less than 250, not less than 1000, not less than 2000, and not less than 3000.

For example, when the size corresponds to 40 W and the number of LED modules to be mounted is 12000, the interval between the LED modules 103 adjacent to each other results from reduction in the distance between the LED modules, and the distance is approximately 0.5 mm. When the area of the substrate 101 (1.7 cm×120 cm: equivalent to the opening area facing the illumination space of the planar light source portion) is converted into the number of LED modules 103 to be mounted, the number of LED modules to be mounted is approximately 600/cm² (12000/(1.7 cm×120 cm)). When an allowance is provided for the interval between the LED modules 103, the number of LED modules 103 to be mounted to the area of the substrate 101 is approximately 5/cm². When a larger allowance is provided for the interval between the LED modules 103, the mounting density of the LED modules 103 to the area of the substrate 101 is approximately 3/cm². Therefore, the number of LED modules to be mounted to the area of the substrate 101 is preferably within the range from approximately 3/cm² to 60/cm². For example, the number is 5/cm², 20/cm², and 40/cm², etc.

From the point of view of the occupation ratio of the total area of the LED modules 103 to the area of the substrate 101, the upper limit of the occupation ratio is preferably approximately 36% (0.1 cm×0.06 cm×12000/(1.7 cm×120 cm)). When the distance between LED modules is set so that the number of LED modules 103 to be mounted to the area of the substrate 101 becomes 3/cm², the occupation ratio of the total area of the LED modules 103 to the area of the substrate 101 becomes approximately 1.8% (0.1 cm×0.06 cm×600/(1.7 cm×120 cm)). Therefore, in this case, the occupation ratio of the total area of the LED modules 103 to the area of the substrate 101 is preferably not less than approximately 1.8%.

The number of the plurality of LED modules 103 (the number of rows) to be mounted in the width direction Y is at least not less than 3 rows. When the interval between the LED modules 103 adjacent to each other is set to approximately 0.5 mm, this number of rows reaches 15. More preferably, the mounting density, the number of LED modules 103 to be mounted per unit length, in the longitudinal direction X is larger than the mounting density per unit length in the width direction Y. The occupation ratio of the LED modules 103 in the longitudinal direction X is preferably larger than the occupation ratio in the width direction Y. For obtaining this configuration, the longitudinal direction of the LED modules 103 may be set along the longitudinal direction X of the substrate 101.

The radiation member 111 is made of, for example, Al, and has a narrow and long block shape extending in the longitudinal direction X of the substrate 101 as shown in FIG. 28 and FIG. 29. As clearly shown in FIG. 30, the radiation member 111 has a hollow semicircular shape in a section. In the hollow portion of the radiation member 111, the power supply substrate 104 and a plurality of power supply components are housed.

The power supply substrate 104 is made of, for example, glass epoxy resin, and is formed to have a long rectangular shape. The plurality of power supply components 105 function as a power supply circuit for driving the LED modules 103, and are mounted on both surfaces of the power supply substrate 104. The plurality of power supply components 105 include an AC/DC converter 151 and other functional components 152 such as capacitors and resistors, and are arranged to convert an alternating current supplied from a commercial power supply into a DC constant current and supply it to the LED modules 103. The AC/DC converter 151 occupies a larger space than other components mounted on the power supply substrate 104.

The case 106 is for housing the substrate 101 and the radiation member 111, and has a straight tube-like cylindrical shape having a circular section as clearly shown in FIG. 30. On the inner surface of the case 106, a pair of projecting pieces 161 projecting inward are formed integrally. The case 106 thus configured is made of a synthetic resin, for example, polycarbonate, and is integrally formed by extrusion molding.

In the housed state shown in FIG. 30, the substrate 101 is restricted from moving in a direction (upward direction in the drawing) perpendicular to the central axis O1 with respect to the case 106 by contact of the upper surface 101a with the projecting pieces 161. The substrate 101, the radiation member 111, and the power supply substrate 104 are housed into the case 106 by inserting the substrate 101 and the radiation member 111 into the case 106 while sliding these below the projecting pieces 161.

The pair of caps 107 are for supplying electric power from a commercial AC power supply by being fitted to a socket of a fluorescent lamp lighting fixture. As shown in FIG. 29, the cap 107 includes a bottomed cylindrical cover body 171, a resin block 172 housed and held in the hollow portion of the cover body 171, and two terminals 173. The radiation member 111 is supported by the pair of caps 107. The terminals 173 and the power supply substrate 104 are connected by electric wires. The terminals 173 are provided to penetrate through the cover body 171 and the resin block 172. One end portions (outer end portions) of the terminals 173 are portions to be fitted to slots of the socket of the fluorescent lamp lighting fixture, and the other end portions of the terminals 173 are electrically conductive between the substrate 101 and the wiring 102.

Next, operations of the LED lamp A11 will be described.

According to the present preferred embodiment, light is emitted from the planar light source portion 103A constituted by the plurality of LED modules 103. For example, when light emitted from a plurality of point light sources is observed, different from the case where a plurality of sharp and bright luminescent spots are observed, light from the planar light source portion 103A is light with entirely uniform luminance. Therefore, without providing the case 106 with a strong diffusion function, uniform light can be emitted from the LED lamp A11. This is suitable for reducing light attenuation due to the case 106, and the luminous efficiency of the LED lamp A11 can be increased.

In order to properly emit planar light with uniform luminance from the planar light source portion 103A, the number of LED modules 103 to be mounted is set to the above-described number, density, or occupation ratio. Array of the LED modules 103 more densely in the longitudinal direction X than in the width direction Y is suitable for preventing light from the LED lamp A11 formed as a straight tube from looking nonuniform in the longitudinal direction X.

As the level of the current If flowing in the LED module 103 (LED chip 131), a value not more than 4.0 mA is comparatively low. In the case of the LED module 103 with specifications to be used in the present preferred embodiment, as the current If becomes smaller, the ratio to be consumed for heat generation in the supplied electric power can be made smaller. Specifically, as in the case of the first preferred embodiment described above, when the LED module 103 is driven with a current not more than 8 mA (more preferably, not more than 4 mA), excellent luminous efficiency is obtained. In other words, when the LED module 103 (LED chip 131) is driven with a current of not more than 20% (more preferably, not more than 40%) of the rated current, excellent luminous efficiency is obtained. For improving the illuminance unevenness, driving of the LED module 103 with a current not more than 8 mA (40% of the rated current) (more preferably, not more than 4 mA (20% of the rated current)) is preferable.

It was also found through the inventors' research that reduction in the current If to be supplied to each LED module 103 is advantageous for reducing the variation in the voltage Vf for setting the current If to a desired level. The inventors measured the voltage Vf for the plurality of LED modules 103 when the current If was regulated to 10, 100, 200, and 300 mA, and evaluates the variation. As a result, the variation coefficients obtained by dividing the standard deviations of the measured voltages Vf by an average were 0.79, 4.6, 6.1, and 5.4 when the current If was 10, 100, 200, and 300 mA in order. The larger the variation coefficient, the larger the variation in the voltage Vf in each measurement. In this measurement, when the current If is 10 mA, the variation is much smaller than other cases. In the present preferred embodiment, the current If flowing in the LED module 103 is 4.0 mA that is smaller than 10 mA, so that it can be assumed that the variation in the voltage Vf is very small.

By providing the oblique joint portion 125, the plurality of LED modules 103 arrayed systematically in the longitudinal direction X can be connected so as to belong to a plurality of groups connected in series to each other. The systematic array of the plurality of LED modules 103 is important for obtaining uniform surface luminescence. Connection of the plurality of LED modules 103 so as to belong to the plurality of groups connected in series to each other is advantageous for setting the current If to be supplied to each LED modules 103 to a low current suitable for high-efficiency luminescence and setting the voltage between the anode electrode 121A and the cathode electrode 121B to approximately 27V that realizes comparatively easy constant current control.

For example, unlike the present preferred embodiment, when electric powers for emitting luminances equivalent to each other were supplied to LED chips the number of which does not constitute the planar light source portion 103A, the temperature of the substrate was 50° C. to 60° C., and on the other hand, in the present preferred embodiment, the temperature of the substrate 101 was 40° C. to 45° C. The possible reason for this is that although the supplied powers are equal to each other, heat radiation is enhanced more in the present preferred embodiment in which LED chips 131 as heat generation sources are mounted in a more dispersed manner. With this configuration including the planar light source portion 103A, heat radiation during illumination can be comparatively advantageously performed.

As described above, inside the case 106, paired projecting pieces 161 are provided, and according to contact of these projecting pieces 161 with the upper surface 101a on both ends in the width direction Y of the substrate 101, the substrate is restricted from moving in a direction (radial direction of the case 106) perpendicular to the central axis O1 of the case 106 with respect to the case 106. Accordingly, when assembling the LED lamp A11, only by inserting the substrate 101 into the case 106, the substrate 101 can be positioned relative to the case 106. Therefore, the LED lamp A11 can be easily assembled.

Figure 36:
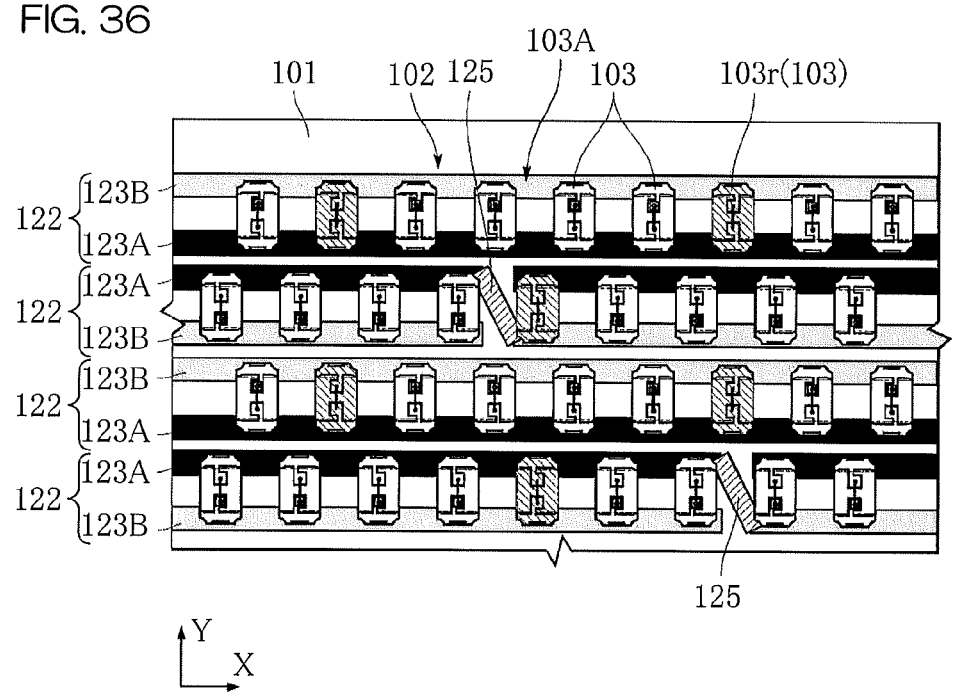
FIG. 36 is a major portion enlarged plan view showing an exemplary variation of a substrate and LED modules of the LED lamp shown in FIG. 28.

FIG. 36 shows an exemplary variation of the array and configuration of the LED modules 103 in the LED lamp A11.

In this exemplary variation, most of the plurality of modules 103 are LED modules that emit white light, and in addition, a small number of LED modules 103r are configured as LED modules that emit red light. The LED modules 103r are arrayed discretely while sandwiching a predetermined number of LED modules 103 that emit white light. With this configuration, light more colorful than white light which is obtained by mixing only blue light and yellow light, that is, light with higher color effect can be emitted.

Figure 37:
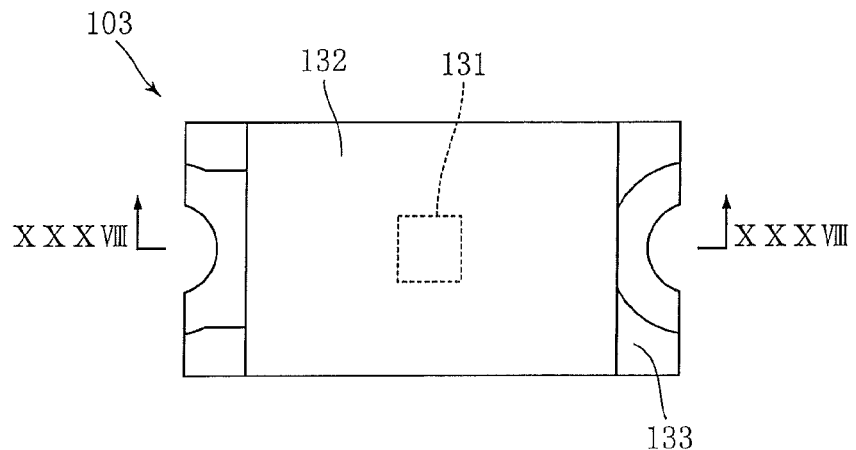
FIG. 37 is a plan view showing an exemplary variation of an LED module of the LED lamp shown in FIG. 28.
Figure 38:
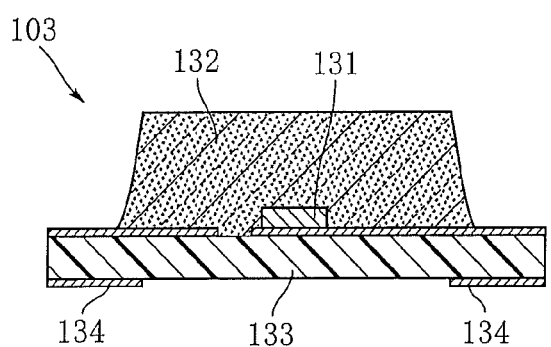
FIG. 38 is a sectional view taken along line XXXVIII-XXXVIII of FIG. 37.
Figure 39:
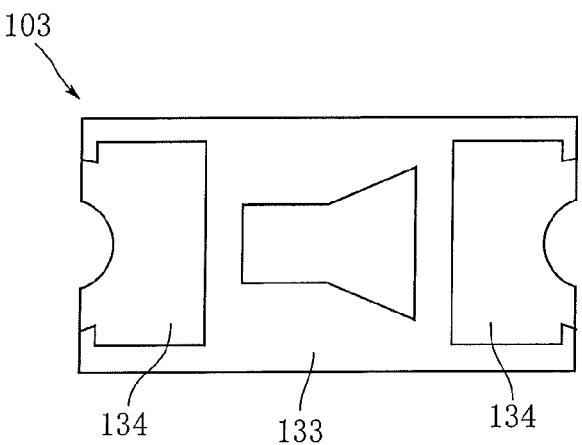
FIG. 39 is a bottom view showing the LED module shown in FIG. 37.

FIG. 37 to FIG. 39 show an exemplary variation of an LED module 103 to be used in the LED lamp A11. In this exemplary variation, the LED module 103 has a size of 1.6 mm×0.8 mm in a plan view and a height of approximately 0.55 mm. In this case, when the interval between the LED modules 103 adjacent to each other is set to 0.5 mm, the occupation ratio of the total area of the LED modules 103 to the area of the substrate 101 can be increased to approximately 47%.

Figure 40:
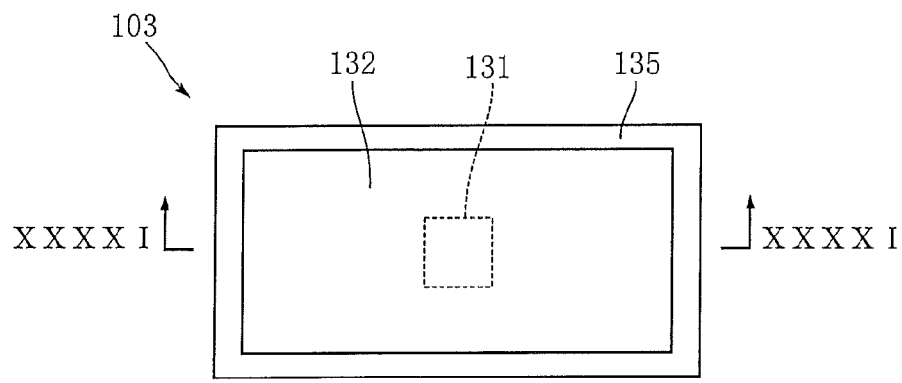
FIG. 40 is a plan view showing another exemplary variation of an LED module of the LED lamp shown in FIG. 28.
Figure 41:
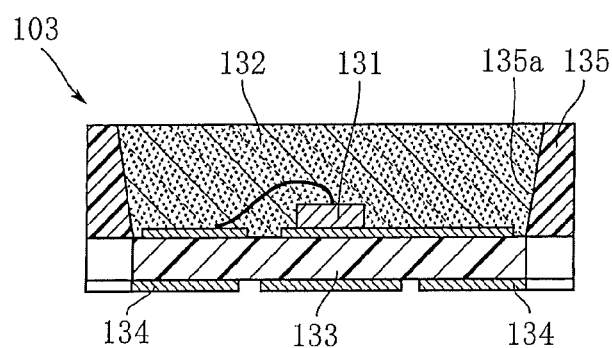
FIG. 41 is a sectional view taken along line XXXXI-XXXXI of FIG. 40.
Figure 42:
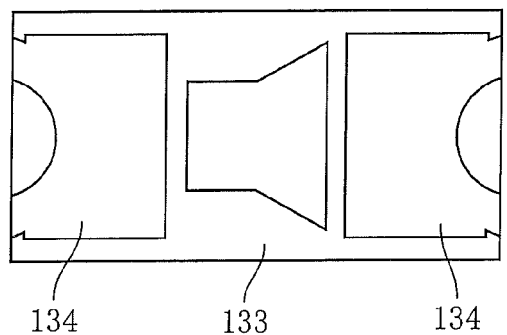
FIG. 42 is a bottom view showing the LED module shown in FIG. 40.

FIG. 40 to FIG. 42 show another exemplary variation of an LED modules 103 to be used in the LED lamp A11. In this exemplary variation, the LED module 103 includes a case 135. The case 135 is made of, for example, white resin, and has a reflecting surface 135a surrounding the LED chip 131 and the resin package 132. The reflecting surface 135a is for directing light advancing sideward from the LED chip 131 upward. Therefore, this LED module 103 belongs to a comparatively high-luminance type. The LED module 103 has a size of 4.0 mm×2.0 mm in a plan view and a height of approximately 0.55 mm. In this case, by setting the interval between the LED modules 103 adjacent to each other to 0.5 mm, the occupation ratio of the total area of the LED modules 103 to the area of the substrate 101 can be increased to approximately 70%.

Figure 43:
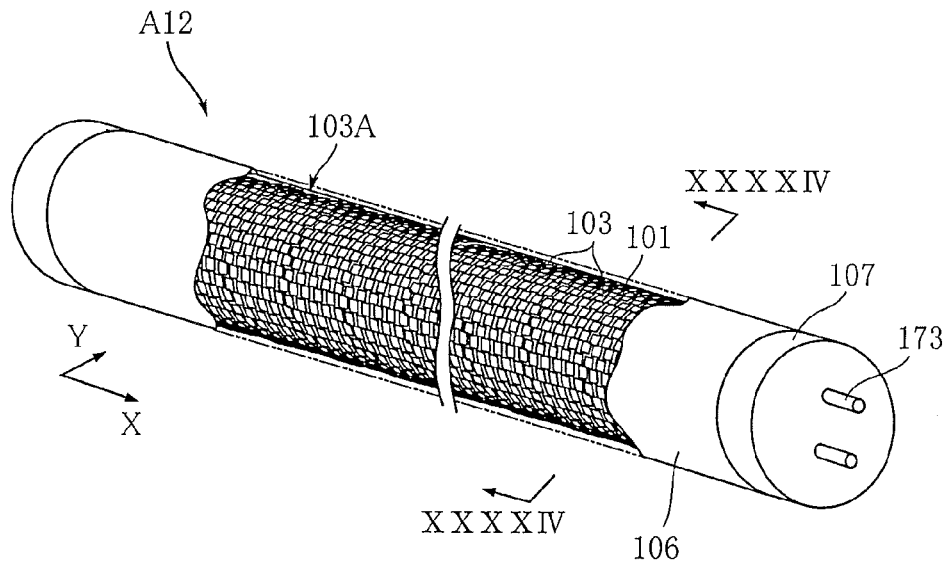
FIG. 43 is a major portion perspective view showing an example of an LED lamp according to a fifth preferred embodiment of the present invention.
Figure 44:
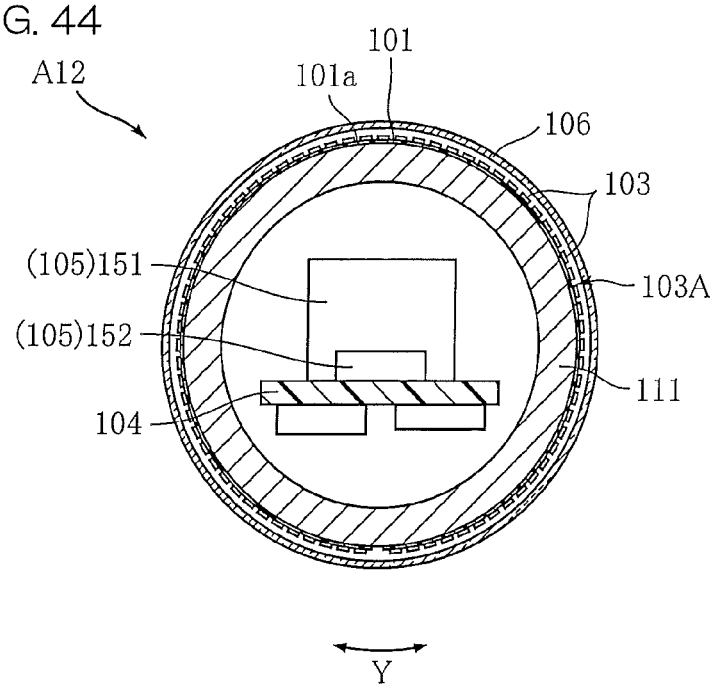
FIG. 44 is a sectional view taken along line XXXXIV-XXXXIV of FIG. 43.

FIG. 43 and FIG. 44 show an LED lamp according to a fifth preferred embodiment of the present invention. In these drawings, elements identical or similar to those in the fourth preferred embodiment described above are provided with the same reference symbols as in the preferred embodiment described above. In the LED lamp A12 of the present preferred embodiment, the configurations of the substrate 101 and the radiation member 111 are different from those of the fourth preferred embodiment described above.

In the present preferred embodiment, as the substrate 101, a flexible wiring substrate made of a comparatively thin resin layer (not shown) and a metal wiring layer (not shown) is used. This substrate 101 has high flexibility, and is wound around a radiation member 111 having a cylindrical shape. Therefore, the width direction y of the substrate 101 is the circumferential direction of the radiation member 111 in the present preferred embodiment.

The metal wiring layer of the substrate 101 has a configuration similar to that of the wiring pattern 102 of the preferred embodiment described above, and a plurality of LED modules 103 are mounted thereon. The plurality of LED modules 103 are arrayed zigzag at a high density.

According to this preferred embodiment, the luminous efficiency of the LED lamp A12 can also be increased. The LED lamp A12 has a form in which the entire surface of the cylinder emits light according to luminescence of the plurality of LED modules 103. Therefore, the diffusion function by the case 106 can be further weakened. This leads to an increase in transmittance of the case 106, and is advantageous for increasing the luminous efficiency of the LED lamp A12.

Further, the area of the substrate 101 on which the LED modules 103 can be mounted can be dramatically increased, and this is preferable for increasing the number of LED modules 103 to be mounted. In detail, the number of LED modules 103 to be mounted can be increased to approximately 9400 when the LED lamp A12 is equivalent to a 10 W lamp, approximately 12500 when the LED lamp A12 is equivalent to a 15 W lamp, approximately 18000 when the LED lamp A12 is equivalent to a 20 W lamp, and approximately 37000 when the LED lamp A12 is equivalent to a 40 W lamp.

Figure 45:
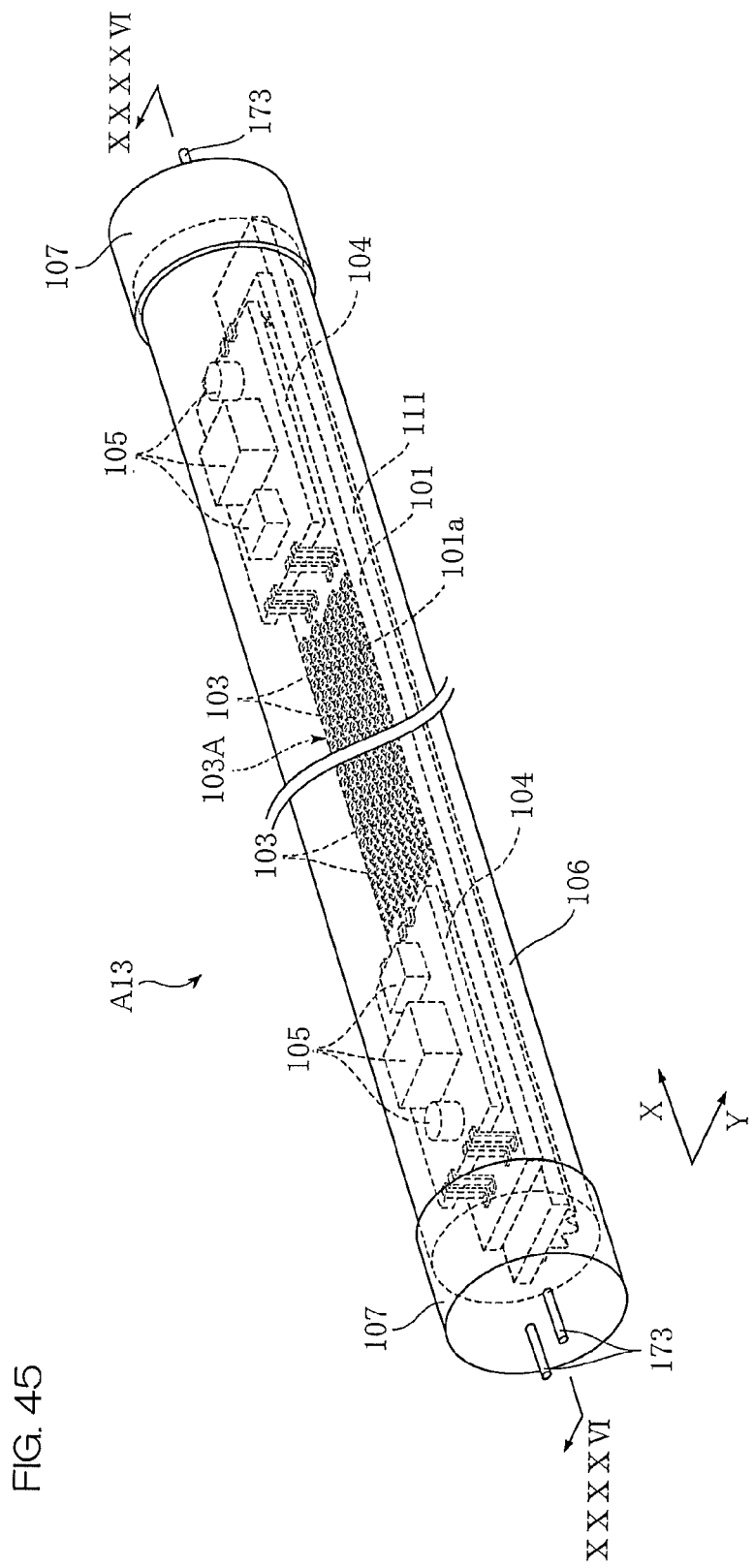
FIG. 45 is a major portion perspective view showing an example of an LED lamp based on a sixth preferred embodiment of the present invention.
Figure 46:
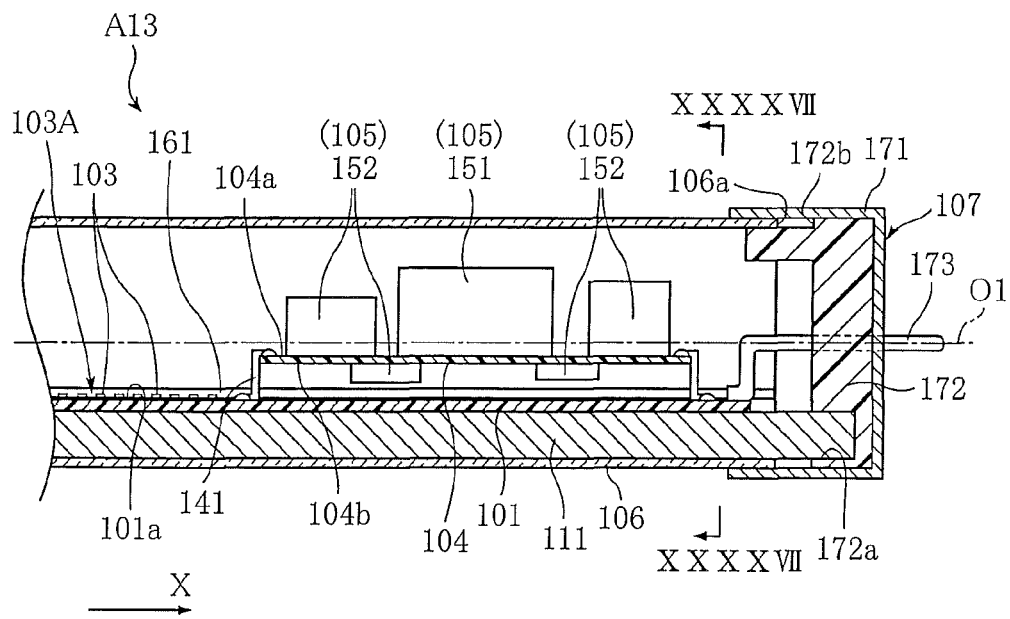
FIG. 46 is a major portion sectional view taken along line XXXXVI-XXXXVI of FIG. 45.
Figure 47:
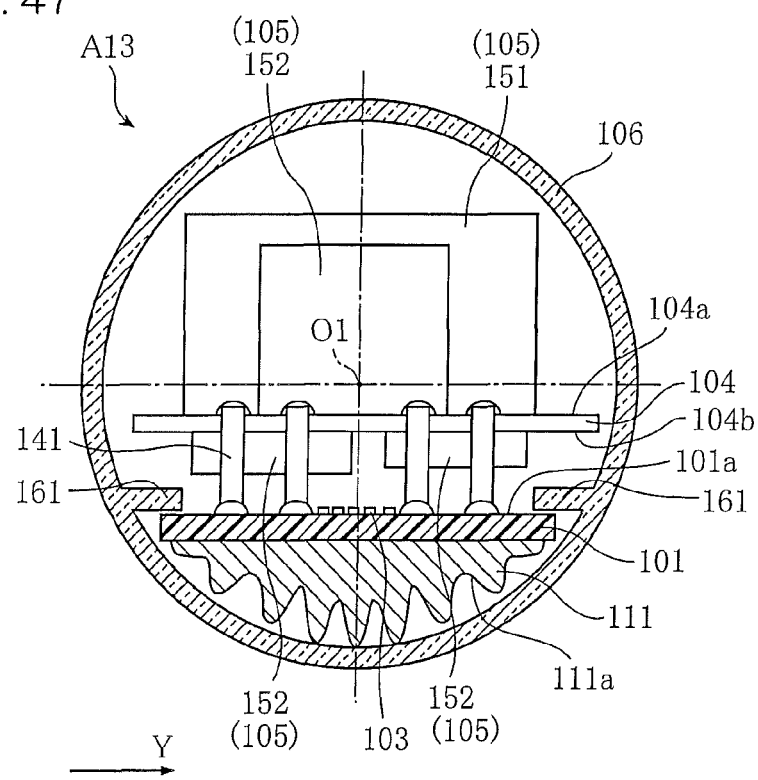
FIG. 47 is a sectional view taken along line XXXXVII-XXXXVII of FIG. 46.
Figure 48:
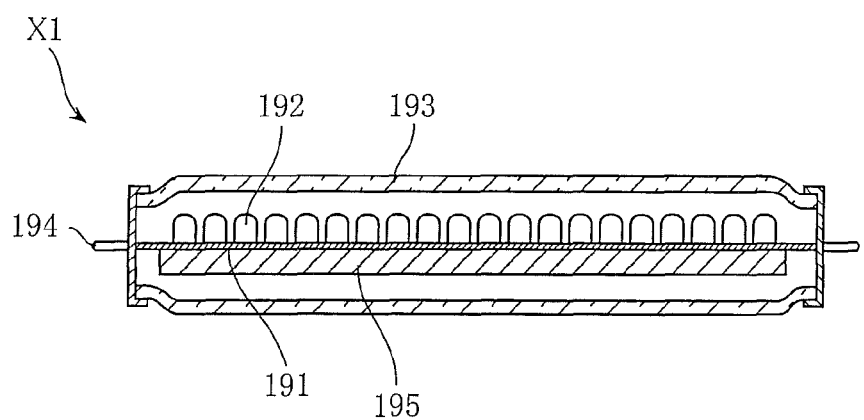
FIG. 48 is a sectional view showing an example of a conventional LED lamp.

FIG. 45 to FIG. 47 show an LED lamp according to a preferred sixth embodiment of the present invention. The LED lamp A13 of the present preferred embodiment has a configuration of the radiation member 111 and a disposition of a plurality of electronic components 105 different from those in the preferred embodiment described above.

In the present preferred embodiment, as clearly shown in FIG. 47, a plurality of recess portions 111a are formed on the surface of the radiation member 111 so that the surface has unevenness. The recess portions 111a are formed over the entire length of the radiation member 111 along the longitudinal direction x of the substrate 101.

The power supply substrate 104 is attached to the substrate 101 by a plurality of metal leads 141. One end portions of the plurality of leads 141 are fixed to both end portions in the longitudinal direction of the power supply substrate 104 by soldering, and the other end portions are soldered on a pad not shown provided on the upper surface 101a of the substrate 101. Accordingly, the power supply substrate 104 is spaced from the substrate 101 or the radiation member 111. The wiring of the substrate 101 and the wiring of the power supply substrate 104 are made electrically conductive to each other via the leads 141.

In the case 106, the projecting pieces 161 are biased to the lower side (in the radial direction) from the central axis O1 of the case 106, project within a plane parallel to the central axis O1, and extend in a direction along the central axis O1. The substrate 101 is at a position biased to the side opposite to the upper surface 101a from the central axis O1 of the case 106, and the power supply substrate 104 is positioned near the central axis O1 of the case 106. Thus, the power supply substrate 104 is positioned closer to the central axis O1 than the substrate 101, so that the width of the power supply substrate 104 can be made larger than the width of the substrate 101. The substrate 101, the radiation member 111, and the power supply substrate 104 are housed into the case 106 by inserting the substrate 101 and the radiation member 111 into the case 106 while sliding below the projecting pieces 161.

The cap 107 includes a bottomed cylindrical cover body 171, a resin block 172 housed and held in the hollow portion of the cover body 171, and two terminals 173. On the resin block 172, a recess portion 172a is formed, and by inserting and fitting the end portion in the longitudinal direction X of the radiation member 111 into the recess portion 172a, the cap 107 is attached to the radiation member 111. Accordingly, in the LED lamp A13, the radiation member 111 is supported by the pair of caps 107.

A partially cylindrical gap is provided between the cover body 171 and the resin block 172, and in a state where the cap 107 is attached to the radiation member 111, both end portions in the longitudinal direction X of the case 106 are inserted in the gap. Here, as clearly shown in FIG. 19, between a tip end edge 106a in the longitudinal direction X of the case 106 and an end edge 172b of the resin block 172, a gap is provided.

With this configuration, a comparatively large-sized AC/DC converter 151 can be properly disposed inside the case 106. Even if the case 106 thermally expands, it can be prevented from interfering with the cap 107.

An LED lamp according to the present invention is not limited to the above-described preferred embodiments.

Detailed configurations of the components of the LED lamps according to the present invention can be variously changed in design.

Other than the configuration in which all LED modules 103 emit light with the same wavelength, a configuration including a plurality of LED modules 103 that emit light with wavelengths different from each other is also possible. For example, a configuration including LED modules 103 that emit incandescent light and LED modules 103 that emit daylight color is also possible. In this case, by controlling the proportions of LED modules 103 that are made to emit light among the incandescent-light LED modules 103 and the daylight-color LED modules 103, or by individually controlling the levels of the currents If of the LED modules 103, incandescent light, warm white, white, neutral white, and daylight color can be arbitrarily irradiated. The LED module 103 is not limited to an LED module including one LED chip 131, and may include, for example, three LED chips 131 that emit red light, green light, and blue light.

Preferred embodiments of the present invention are described in detail above; however, these are just the detailed examples used for clarifying the technical contents of the present invention, and the present invention should not be interpreted as being limited to detailed examples, and the spirit and scope of the present invention shall be limited only by the accompanying claims.

The present application corresponds to:
Japanese Patent Application No. 2008-206865 filed in the Japan Patent Office on Aug. 11, 2008,
Japanese Patent Application No. 2008-317048 filed in the Japan Patent Office on Dec. 12, 2008,
Japanese Patent Application No. 2008-324837 filed in the Japan Patent Office on Dec. 22, 2008,
Japanese Patent Application No. 2009-3727 filed in the Japan Patent Office on Jan. 9, 2009, and
Japanese Patent Application No. 2009-108334 filed in the Japan Patent Office on Apr. 27, 2009,
the whole disclosures of which are incorporated herein by reference.

DESCRIPTION OF REFERENCE SYMBOLS

A1, A2, A3: a lighting device, D1: (substrate-side opening) diameter, D2: (exist-side opening) diameter, x: (second) direction, y: (first) direction, H: distance, 1: substrate, 2: wiring pattern, 3: LED module, 3A: planar light source portion, 4: reflector, 5: housing, 6: connector, 7: holder, 8: support substrate, 9: columnar support, 21A: anode electrode, 21B: cathode electrode, 22: pad portion, 23A: anode linear portion, 23B: cathode linear portion, 23Aa: anode widened portion, 23Ba: cathode widened portion, 24A: anode folding portion, 24B: cathode folding portion, 25: oblique joint portion, 26: straight joint portion, 27A: anode connecting portion, 27B: cathode connecting portion, 28: nonconductive radiation portion, 31: LED chip, 31A: group, 32: resin package, 33: substrate, 34: mounting terminal, 41: (substrate side) opening, 42: (exit side) opening, 51: bottom portion, 52: cylindrical portion, 60: power supply unit, 60A: power supply substrate, 61: surge protection circuit, 62: filter circuit, 63: rectifying circuit, 64: control circuit, 65: reverse voltage protection circuit, 66: commercial AC power supply, 67, 68: power feeder, 69: fuse, 70: varistor, 71: inductor, 72, 73: capacitor, 74: diode, 75: constant current driver, 75a, 75b: power supply terminal, 75c: control terminal, 75d, 75e: output terminal, 76 to 78: smoothing capacitor, 79: current setting resistor element, 80, 81: DC power feeder, 82, 83: output terminal, 84, 85: output line, 86, 87: lead wire, A11, A12, A13: LED lamp, 101: substrate, 101a: upper surface, 102: wiring pattern, 103, 103r: LED module, 103A: planar light source portion, 104: power supply substrate, 104a: upper surface, 104b: lower surface, 105: power supply component, 106: case, 107: cap, 111: radiation member, 122: pad portion, 123A: anode linear portion, 123B: cathode linear portion, 125: oblique joint portion, 131: LED chip, 131A: group, 132: resin package, 133: substrate, 134: mounting terminal, 151: AC/DC converter, 161: projecting piece, 171: cover body, 172: resin block, 173: terminal

What is claimed is:

1. A lighting device comprising:
a substrate;
a plurality of LED chips arrayed on the substrate; and
a constant current power supply which supplies a current to the plurality of LED chips, wherein
the plurality of LED chips belong to a plurality of groups connected in series to each other, and
the plurality of LED chips belonging to each group are connected in parallel to each other,
the plurality of groups are connected in series to the constant current power supply, and
a number of the LED chips in each group is selected such that a drive current per one LED chip is not more than 40% of a rated current of the LED chip.

2. The lighting device according to claim 1, wherein the number of the LED chips in each group is selected such that the drive current per one LED chip is not more than 20% of the rated current of the LED chip.

3. The lighting device according to claim 1, wherein the number of the LED chips in each group is selected such that the drive current per one LED chip is within a range of 20±3% of the rated current of the LED chip.

4. The lighting device according to claim 1, comprising a plurality of LED modules each of which includes one or more of the LED chips and a pair of mounting terminals spaced from each other.

5. The lighting device according to claim 4, wherein each of the plurality of LED modules is disposed in a posture in which the pair of mounting terminals are spaced from each other in a first direction, and the plurality of LED modules are arrayed so as to form a plurality of rows disposed parallel to each other along a second direction perpendicular to the first direction.

6. The lighting device according to claim 5, wherein the plurality of LED modules are arrayed zigzag.

7. The lighting device according to claim 1, further comprising:
a reflector which surrounds the plurality of LED chips,
a housing disposed on a side opposite to the reflector, and
a power supply substrate housed inside the housing, the power supply substrate forming the constant current power supply.

8. The lighting device according to claim 1, wherein
the constant current power supply includes a current setting resistor element that sets a supply current value of the constant current power supply, and
a resistance value of the current setting resistor element and the number of LED chips in each group are designed such that the drive current per one LED chip is not more than 40% of the rated current of the LED chip.

9. The lighting device according to claim 1, wherein the constant current power supply includes a reverse voltage protection circuit connected between a pair of output lines which supplies a current to the plurality of LED chips, and the reverse voltage protection circuit prevents a reverse voltage from being applied to the plurality of LED chips.

10. A lighting device comprising:
a substrate;
a plurality of LED chips arrayed on the substrate; and
a plurality of LED modules each of which includes one or more of the LED chips and a pair of mounting terminals spaced from each other, wherein
each of the plurality of LED modules is disposed in a posture in which the pair of mounting terminals are spaced from each other in a first direction, and the plurality of LED modules are arrayed so as to form a plurality of rows disposed parallel to each other along a second direction perpendicular to the first direction,
a wiring pattern is formed on the substrate, the wiring pattern including a plurality of pad portions each of which extends in the second direction and includes an anode linear portion and a cathode linear portion disposed parallel and spaced from each other in the first direction, and an oblique joint portion which joins the anode linear portion of one of a pair of the pad portions and the cathode linear portion of the other of the pair of the pad portions, the pair of the pad portions being adjacent to each other in the second direction, the anode linear portions and the cathode linear portions of the pair of the pad portions being disposed on same sides in the first direction, and
the plurality of LED modules are mounted across the anode linear portions and the cathode linear portions.

11. The lighting device according to claim 10, wherein the wiring pattern includes an anode folding portion which joins the anode linear portions adjacent to each other in the first direction, and a cathode folding portion which joins the cathode linear portions adjacent to each other in the first direction.

12. The lighting device according to claim 10, wherein the wiring pattern further includes a straight joint portion which joins the anode linear portion of one of a pair of the pad portions and the cathode linear portion of the other of the pair of the pad portions, the pair of the pad portions being adjacent to each other in the second direction, the anode linear portions and the cathode linear portions of the pair of the pad portions being disposed on sides opposite to each other in the first direction.

13. The lighting device according to claim 12, further comprising an anode electrode and a cathode electrode disposed close to one side in the second direction with respect to the plurality of pad portions.

14. The lighting device according to claim 10, wherein the cathode linear portions or the anode linear portions have widths overlapping the LED chips of the LED modules in a plan view.

15. The lighting device according to claim 10, wherein the wiring pattern includes at least one of an anode widened portion and a cathode widened portion disposed close to an end portion of the substrate and having an external shape along an end edge of the substrate.

16. The lighting device according to claim 10, wherein the wiring pattern includes a nonconductive radiation portion which is electrically nonconductive to the anode linear portions and the cathode linear portions, and positioned close to an end portion of the substrate with respect to the anode linear portions and the cathode linear portions.

17. The lighting device according to claim 10, wherein the plurality of LED modules are arrayed zigzag.

18. The lighting device according to claim 10, wherein
the substrate is circular, and
the lighting device further comprising a reflector which is formed to widen toward an end in a normal direction of a surface of the substrate on which the plurality of LED chips are mounted, and surrounds the plurality of LED chips.

19. The lighting device according to claim 18, further comprising:
a housing made of metal which is disposed on a side opposite to the reflector with respect to the substrate and includes a bottom portion in contact with the substrate and a cylindrical portion connected integrally to the bottom portion.

20. The lighting device according to claim 19, further comprising a power supply substrate housed inside the housing, the power supply substrate forming a power supply unit which supplies a current to the plurality of LED chips.

* * * * *